(12) United States Patent
Lee

(10) Patent No.: US 7,346,861 B1
(45) Date of Patent: Mar. 18, 2008

(54) PROGRAMMABLE LOGIC DEVICES WITH TWO-PHASE LATCH CIRCUITRY

(75) Inventor: Andy L Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 330 days.

(21) Appl. No.: 11/002,324

(22) Filed: Dec. 2, 2004

(51) Int. Cl.
*G06F 17/50* (2006.01)

(52) U.S. Cl. ............ 716/2; 716/3; 716/6; 703/19; 326/95; 326/96; 326/97

(58) Field of Classification Search ............ 716/2, 716/3, 6; 703/19; 326/95–97
See application file for complete search history.

(56) References Cited

U.S. PATENT DOCUMENTS

| | | | | |
|---|---|---|---|---|
| 4,990,801 A | * | 2/1991 | Caesar et al. | 326/45 |
| 5,095,454 A | * | 3/1992 | Huang | 703/19 |
| 5,259,006 A | * | 11/1993 | Price et al. | 375/356 |
| 7,047,508 B2 | * | 5/2006 | Chiu | 716/6 |
| 2003/0149943 A1 | * | 8/2003 | Yoshikawa | 716/1 |
| 2006/0015786 A1 | * | 1/2006 | Mitra et al. | 714/724 |

OTHER PUBLICATIONS

Ishii A. et al., "Optimizing two-phase, level-clocked circuitry", Journal of the ACM (JACM), vol. 44, Issue 1, Jan. 1997, pp. 148-199.*

* cited by examiner

*Primary Examiner*—Thuan Do
*Assistant Examiner*—Naum B. Levin
(74) *Attorney, Agent, or Firm*—Ropes & Gray LLP

(57) ABSTRACT

Programmable logic circuitry includes level-sensitive latches as at least some of the data storage elements. At least some of the latches are enabled by one phase of a clock signal, and at least some others of the latches are enabled by the other phase of the clock signal. Accordingly, these latches collectively have two-phase operation. These two-phase latches may replace at least some single-phase, edge-triggered flip-flops in a user's logic design, and may thereby increase the speed at which the user's logic can be operated. Methods for converting a single-phase, edge-triggered flip-flop design to a logically equivalent design using at least some two-phase latches are disclosed.

19 Claims, 17 Drawing Sheets

PROGRAMMABLE LOGIC DEVICES WITH TWO-PHASE LATCH CIRCUITRY

BACKGROUND OF THE INVENTION

This invention relates to programmable logic devices ("PLDs"), and more particularly to PLDs that include or that can include two-phase latches.

PLDs typically use single-phase, edge-triggered data storage circuitry (e.g., flip-flops) to register data signals propagating through the processing or logic circuitry of the PLD. This limits the speed at which the PLD can be made to operate (i.e., clocked) to the maximum signal propagation delay from one register to another register on the device. For example, if the maximum propagation delay between two single-phase, edge-triggered registers is 12 nanoseconds ("ns"), the period of the clock cannot be less than 12 ns. Even if the propagation delay between other registers is less than 12 ns, the slowest path controls, and it is not possible to decrease the period of the clock. Introducing another register in the path between two registers having a long inter-register propagation delay may decrease the maximum inter-register delay and thereby allow the clock period to be decreased. But this may also unacceptably or at least undesirably increase the latency of the signal(s) being propagated.

SUMMARY OF THE INVENTION

To address problems like the foregoing, a PLD is provided with level-sensitive latches in lieu of or as an alternative to single-phase, edge-triggered data signal storage elements. Each such level-sensitive latch is preferably selectively clockable with either of the two phases (true and complement) of a clock signal. A latch that is clocked by a first of the two phases (e.g., the true or high phase) may be referred to as a high-phase latch. A latch that is clocked by a second of the two phases (e.g., the complement or low phase) may be referred to as a low-phase latch. The paths through which data signals propagate are interspersed with alternating high- and low-phase latches. For example, a path that in a prior art design would have extended from a first single-phase, edge-triggered flip-flop through a second single-phase, edge-triggered flip-flop to a third single-phase, edge-triggered flip-flop may be implemented in accordance with this invention by a path extending from a first high-phase latch (taking the place of the first flip-flop), through a second low-phase latch, through a third high-phase latch (taking the place of the second flip-flop), through a fourth low-phase latch, through a fifth high-phase latch (taking the place of the third flip-flop), and to a sixth low-phase latch (to maintain the original circuit functionality). If in the prior art design the propagation delay from the first to second registers (flip-flops) was longer than the propagation delay from the second to third registers (flip-flops), the implementation of this invention can be used to effectively "borrow" some time from the faster leg (from the third to fifth latches) for use in the slower leg (from the first to third latches) and thereby allow a PLD of this invention to be clocked faster than would be possible if the limiting propagation delay were the delay between the first and second registers in the prior art design. In effect, this invention allows some "averaging" of propagation delays, so that clock speed can be based on such an average, rather than being limited by a "worst case" propagation delay.

The invention can be implemented in PLD circuitry that has the capability of selectively providing either single-phase, edge-triggered data storage elements or two-phase, level-sensitive data storage elements. This is presently preferred. But an alternative is to provide two-phase, level-sensitive data storage elements in lieu of single-phase, edge-triggered elements.

Other aspects of the invention relate to methods for converting circuit designs done conventionally for implementation on a PLD to logically equivalent designs that use two-phase, level-sensitive latches and that are implementable on the PLD as possibly faster alternatives to the original designs. For example, these methods may involve use of two-phase, level-sensitive latches as replacements for and additions to single-phase, edge-triggered registers in a conventional design to effectively shift some of the register-to-register delay between circuitry that is upstream from a register and circuitry that is down-stream from that register. Such effective shifting of register-to-register delay may help to ease the constraint that the period of the clock signal operating the circuitry cannot be any less than the "worst case" register-to-register delay, and may as a result allow the circuitry implemented with two-phase, level-sensitive latches to be operated with a faster clock signal.

Further features of the invention, its nature and various advantages, will be more apparent from the accompanying drawings and the following detailed description.

DETAILED DESCRIPTION

Figure 1:
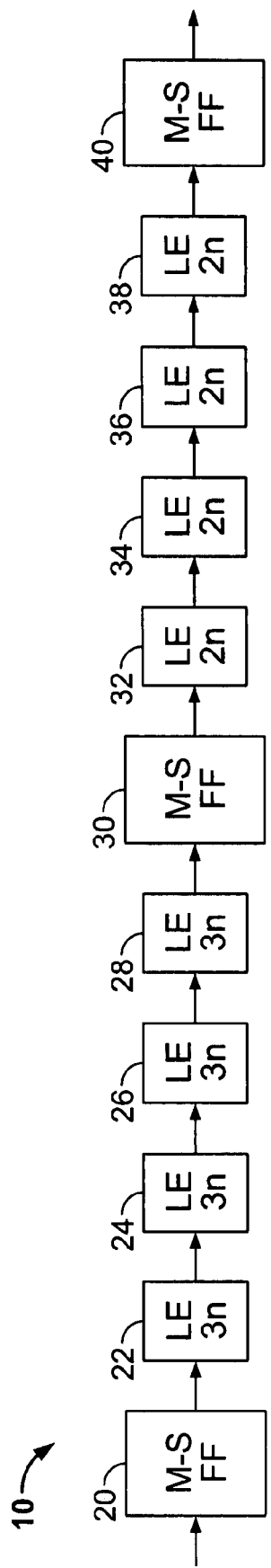
FIG. 1 is a simplified block diagram of illustrative prior art circuitry that is useful as background for this invention.

FIG. 1 shows some representative prior art PLD circuitry 10 to illustrate issues addressed by this invention. Circuitry 10 includes a first master-slave ("M-S") flip-flop ("FF") 20, from which data propagates successively through logic elements ("LEs") 22, 24, 26, and 28 to second master-slave flip-flop 30. From flip-flop 30 data propagates successively through logic elements 32, 34, 36, and 38 to third master-slave flip-flop 40. Each of logic elements 22-28 is characterized by a propagation delay of 3 nanoseconds ("n" or "ns"). Each of logic elements 32-38 is characterized by a propagation delay of 2 nanoseconds. Accordingly, the register to register delay from FF 20 to FF 30 is 12 ns. The register to register delay from FF 30 to FF 40 is 8 ns. (Although FIG. 1 shows only LEs, it will be understood that a PLD may also include other types of circuit modules such as memory blocks, digital signal processing ("DSP") blocks, etc., and that any one or more of the LEs in FIG. 1 or in other similar FIGS. throughout this disclosure can be replaced by any of these other types of circuit blocks. Similarly, the FFs or latches referred to throughout this specification can be stand-alone circuit elements or they can be associated with any of the various types of circuit blocks that can be provided on a PLD such as LEs, memory blocks, DSP blocks, input/output ("I/O") blocks, etc. The LE example will be mentioned most frequently; but LEs are only an example, and the FFs and latches that are the subject of this invention can be the FFs or latches of many other types of circuit blocks such as the above-mentioned memory, DSP, I/O, etc., circuit blocks.)

Figure 2:
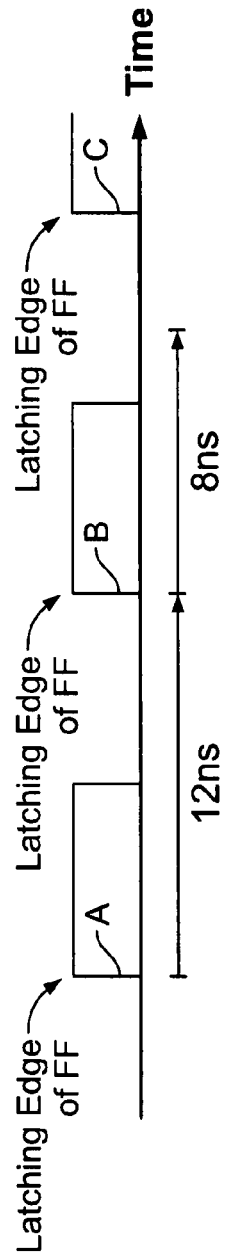
FIG. 2 is a simplified waveform of a clock signal that can be used in the circuitry of FIG. 1.

FIG. 2 shows the fastest clock signal that can be used with circuitry 10. This is a clock signal having a period of 12 ns. This is the time required for a signal to propagate from the output of FF 20, successively through LEs 22-28, to FF 30. It does not matter that it takes only 8 ns for a signal to propagate from the output of FF 30, successively through LEs 32-38, to FF 40. The controlling consideration in the type of circuitry shown in FIG. 1 is the longest register-to-register delay, which in the example shown in FIG. 1 is 12 ns. Arbitrarily (in FIG. 2) associating depicted latching edges A, B, and C with FFs 20, 30, and 40, FF 30 cannot be clocked to latch until 12 ns after the output signal of FF 20 is available. This is shown by the 12 ns dimension line in FIG. 2. FF 40 could theoretically be clocked to latch as early as 8 ns after that (as shown by the 8 ns dimension line in FIG. 2), but this is not possible because only a 12 ns clock is available, as is required for satisfactory operation of the worst case data path from FF 20 to FF 30.

It will be understood that in FIG. 1 each of FFs 20, 30, and 40 is single-phase, edge-triggered circuitry, as is typical for the data signal storage elements in conventional PLDs. It will also be understood that each LE in FIG. 1 typically includes an FF (see also FIG. 7), although only the FFs shown in FIG. 1 are actually used (at least in the data flow being discussed). Thus FF 30 may be part of LE 28, and FF 40 may be part of LE 38 (although this is not necessarily the case). It will still further be understood that some or all of LEs 22-28 and 32-38 may also receive other signals, e.g., for logical combination in the LE with the signals flowing in the depicted register-to-register paths. And it will be understood that the numbers of LEs shown between FFs in FIG. 1 are only examples, as are the propagation delays shown for the various LEs. Other numbers of LEs and different propagation delays may occur in other situations.

Figure 3:
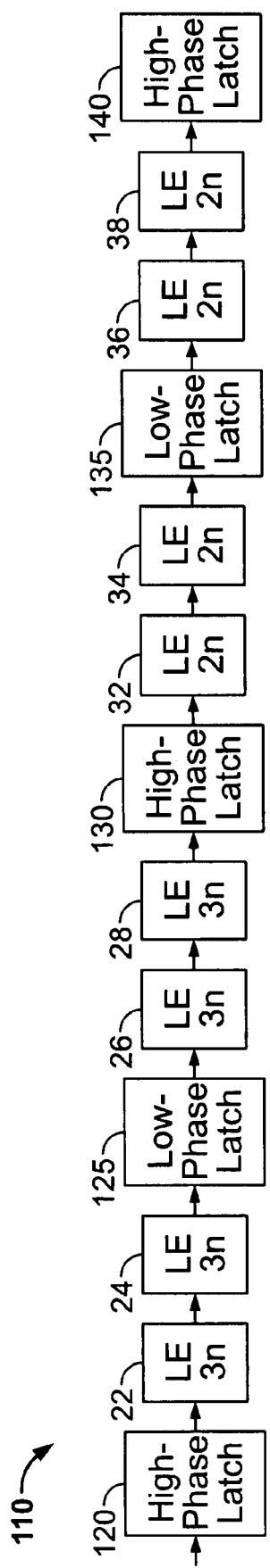
FIG. 3 is a simplified block diagram of an illustrative embodiment of modification of the circuitry of FIG. 1 in accordance with the invention.

FIG. 3 shows an example of modification of the type of circuitry shown in FIG. 1 in accordance with this invention. In FIG. 3 circuitry 110 is shown as having the same flow of data through the same LEs 22-28 and 32-38 as is shown in FIG. 1. In FIG. 3, however, level-sensitive latches 120, 125, 130, 135, and 140 (rather than FFs) are used as the data storage elements. In particular, so-called high-phase latch 120 takes the place of M-S FF 20, so-called low-phase latch 125 is interposed between LEs 24 and 26, high-phase latch 130 takes the place of M-S FF 30, low-phase latch 135 is interposed between LEs 34 and 36, and high-phase latch 140 takes the place of M-S FF 40. A sixth low-phase latch (not shown in FIG. 3) is required downstream from high-phase latch 140 to maintain the functionality that the original circuitry has. This sixth low-phase latch can be immediately associated with high-phase latch 140, or it can be spaced from latch 140 by one or more additional LEs like LEs 22-28 and 32-38. The former configuration might be used if the circuitry effectively ends at latch 140 or if the conversion of M-S FFs to two-phase, level-sensitive latches ends or is interrupted at latch 140. The latter configuration might be used if the conversion of M-S FFs to two-phase, level-sensitive latches continues beyond latch 140. Because there are these different possibilities regarding the sixth latch, it will hereinafter generally be assumed to be present in the appropriate way and will not be mentioned again.

Figure 5:
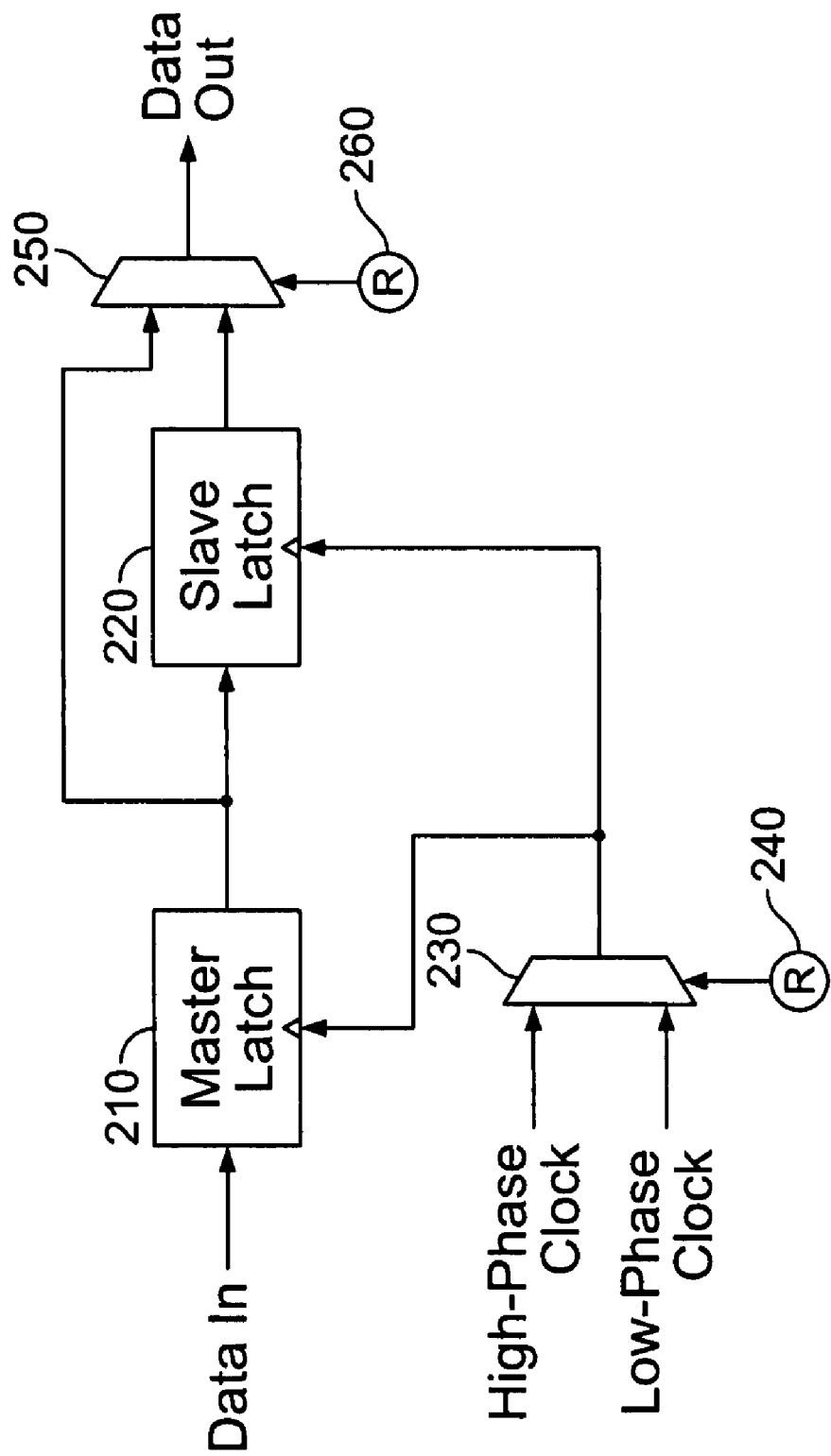
FIG. 5 is a simplified schematic block diagram of an illustrative embodiment of circuitry that can be used to implement portions of the FIG. 1 or FIG. 3 circuitry in accordance with the invention.

One way that level-sensitive latches like 120, 125, 130, 135, and 140 in FIG. 3 can be provided is illustrated by FIG. 5. In FIG. 5 master latch circuitry 210 and slave latch circuitry 220 can be the master and slave latches of a conventional master-slave flip-flop ("M-S FF"). Latches 210 and 220 can be clocked by either a high-phase (or true) clock signal or a low-phase (or complement) clock signal, as selected by multiplexer 230 under the control of programmable configuration RAM cell ("CRAM") 240. The high-phase clock is 180° out of phase with the low-phase clock, and it is assumed that each of these clocks has a 50% duty cycle. Master latch 210 is able to receive and store an applied data signal while the applied clock signal has a particular level or polarity (e.g., a low or logic 0 level). Master latch 210 outputs whatever data signal it is storing until the master latch can and does accept different data. Assuming, for example, that master latch 210 is enabled by a logic 0 clock signal level to receive and store a data signal, and further assuming that some time during the logic 0 half-cycle of the clock signal the master latch does receive and store some particular data, the master latch will immediately begin to output that particular data and will continue to output that data throughout the succeeding logic 1 half-cycle of the clock signal. Master latch 210 is not responsive to any change in the applied data signal while the applied clock signal is high. But it can receive and begin to output new data as soon as the applied clock signal becomes logic 0 again. Slave latch 220 operates similarly, except that slave latch 220 is responsive to the opposite level or polarity of the applied clock signal. In other words, if master latch 210 is "opened" when the applied clock signal is low, slave latch 220 is "opened" when the applied clock signal is high.

Multiplexer 250 (controlled by programmable CRAM cell 260) allows slave latch 220 to be used (with master latch 210) or bypassed as desired. If slave latch 220 is used, the circuitry operates as an M-S FF. If slave latch 220 is bypassed, only master latch 210 is used. The circuitry then operates as a level-sensitive latch (as in the above description of the operation of the master latch). Multiplexer ("mux") 230 allows the data storage circuitry (whether operating as an M-S FF or as a level-sensitive latch (master latch 210 only)) to be responsive to either the high-phase clock signal or the low-phase clock signal. Particularly significant in connection with the present invention (i.e., when slave latch 220 is bypassed) is the fact that mux 230 and the associated high- and low-phase clock signals allow master latch 210 to operate as either a "high-phase latch" or a "low-phase latch", depending on whether mux 230 is controlled (by programmable CRAM cell 240) to apply the high-phase clock signal or the low-phase clock signal to the master latch.

Figure 4:
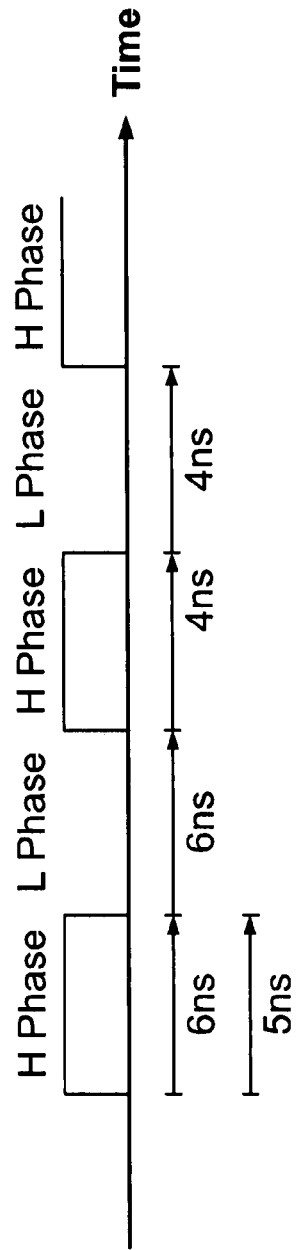
FIG. 4 is a simplified waveform of a clock signal that can be used in the circuitry of FIG. 3 in accordance with the invention.

Returning now to FIG. 3, and continuing with the comparison of that FIG. to FIG. 1, in FIG. 3 M-S FF 20 from FIG. 1 is replaced by high-phase latch 120. This can be circuitry like that shown in FIG. 5 in which slave latch 220 is bypassed and mux 230 is controlled to pass the high-phase clock signal. This causes latch 120 to accept data while a reference clock (same as the high-phase clock) is high (e.g., as in the left-most H phase shown in FIG. 4). Assuming that the reference clock signal has a period of 10 ns and a 50% duty cycle as shown in FIG. 4, high-phase latch 120 will continue to output this data for at least 10 ns (i.e., through the left-most H phase in FIG. 4 and the subsequent L phase in that FIG.). (This discussion assumes that data is ready at the input of high-phase latch 120 at the rise of the first clock cycle shown in FIG. 4.)

From the time that high-phase latch 120 begins to output the data mentioned in the preceding paragraph (i.e., from the start of the left-most H phase in FIG. 4), it takes 6 ns for that data to affect the output signal of LE 24. This is due to the 6 ns propagation delay through LEs 22 and 24, which is indicated by the left-most 6 ns dimension in FIG. 4. This signal information thus arrives at low-phase latch 125 during the left-most L phase of the reference clock signal shown in FIG. 4. Low-phase latch 125 can be another instance of circuitry like that shown in FIG. 5 in which slave latch 220 is bypassed but in which mux 230 is controlled to pass the low-phase clock signal. This causes latch 125 to accept data while the reference clock shown in FIG. 4 (inverse or complement of the low-phase clock) is low. Accordingly, in the particular example being discussed, 1 ns after the start of the left-most L phase shown in FIG. 4, low-phase latch 125 latches in and begins to output the data it receives that includes the effect of the data that high-phase latch 120 began to output 6 ns earlier. Low-phase latch 125 continues to output this data at least until the end of the next H phase in the reference clock signal shown in FIG. 4.

From the time that low-phase latch 125 begins to output the data mentioned in the preceding paragraph (i.e., from 1 ns after the start of the left-most L phase in FIG. 4), it takes a further 6 ns for that data to affect the output signal of LE 28. This is due to the 6 ns propagation delay through LEs 26 and 28, and is indicated by the next-to-left-most 6 ns dimension in FIG. 4. This signal information therefore arrives at high-phase latch 130 during the next-to-left-most H phase of the reference clock signal shown in FIG. 4. High-phase latch 130 can be another instance of what is described above for high-phase latch 120. Latch 130 therefore accepts data while the reference clock shown in FIG. 4 is high. Thus, in the particular example being discussed, 2 ns after the start of the next-to-left-most H phase in FIG. 4, high-phase latch 130 latches in and begins to output the data it receives that includes the effect of the data that low-phase latch 125 began to output 6 ns earlier. High-phase latch 130 continues to output this data at least until the end of the next L phase in the reference clock signal shown in FIG. 4.

From the time that high-phase latch 130 begins to output the data mentioned in the preceding paragraph (i.e., from 2 ns after the start of the next-to-left-most H phase in FIG. 4), it takes a further 4 ns for that data to affect the output signal of LE 34. This is due to the 4 ns propagation delay through LEs 32 and 34, and is indicated by the left-most 4 ns dimension in FIG. 4. This signal information therefore arrives at low-phase latch 135 during the next-to-left-most L phase of the reference clock signal shown in FIG. 4. Low-phase latch 135 can be another instance of what is described above for low-phase latch 125. Latch 135 therefore accepts data while the reference clock shown in FIG. 4 is low. Thus in the particular example being discussed, 1 ns after the start of the next-to-left-most L phase in FIG. 4, low-phase latch 135 latches in and begins to output the data it receives that includes the effect of the data that high-phase latch 130 began to output 4 ns earlier. Low-phase latch 135 continues to output this data at least until the end of the next H phase in the reference clock signal shown in FIG. 4.

From the time that low-phase latch 135 begins to output the data mentioned in the preceding paragraph (i.e., from 1 ns into the next-to-left-most L phase in FIG. 4), it takes a further 4 ns for that data to affect the output signal of LE 38. This is due to the 4 ns propagation delay through LEs 36 and 38, and is indicated by the right-most 4 ns dimension in FIG. 4. This signal information therefore arrives at high-phase latch 140 at the start of the right-most H phase of the reference clock signal shown in FIG. 4. High-phase latch 140 can be another instance of circuitry like high-phase latch 130. Accordingly, latch 140 accepts data while the reference clock shown in FIG. 4 is high. Thus in the particular example being discussed, at the start of the right-most H phase in FIG. 4, high-phase latch 140 latches in and begins to output the data it receives that includes the effect of the data that low-phase latch 135 began to output 4 ns earlier.

It will be seen from the foregoing that, as compared to what is shown in FIGS. 1 and 2, the circuit arrangement shown in FIG. 3 allows the same basic logic to be operated considerably faster. In FIG. 1 the fastest clock that can be used has a period of 12 ns (see FIG. 2). But the circuit arrangement shown in FIG. 3 allows the use of a considerably faster clock, i.e., a clock having a period of only 10 ns as shown in FIG. 4. This is possible because of the use of alternating high- and low-phase latches 120, 125, 130, 135, and 140 (instead of only single-phase FFs as shown in FIG. 1), and because of the inclusion of some of these latches at intermediate points in the logic where data latching would not otherwise be done in an implementation using only single-phase FFs. In effect, the approach taken in accordance with this invention allows a portion of the logic having a relatively long propagation delay to shift some of that delay to another portion of the logic having a relatively short propagation delay. Thus in the example shown in the FIGS., some of the relatively long propagation delay of relatively slow logic elements 22-28 is effectively shifted to the portion of the logic that includes relatively faster logic elements 32-38. In this way, instead of being controlled by the "worst case" propagation delay as in FIGS. 1 and 2, the clock speed can be based more on an "average" propagation delay as in FIGS. 3 and 4. In FIGS. 1 and 2 the "worst case"

propagation delay is 12 ns between FFs 20 and 30, which prevents the logic from being operated with a clock having a period less than 12 ns. But in FIGS. 3 and 4 the "average" propagation delay (between high-phase latches) is 10 ns, allowing the circuitry to be operated with a clock having a period of 10 ns. The invention therefore allows the same basic logic circuitry to be operated with a significantly faster clock than could otherwise be used.

Figure 6:
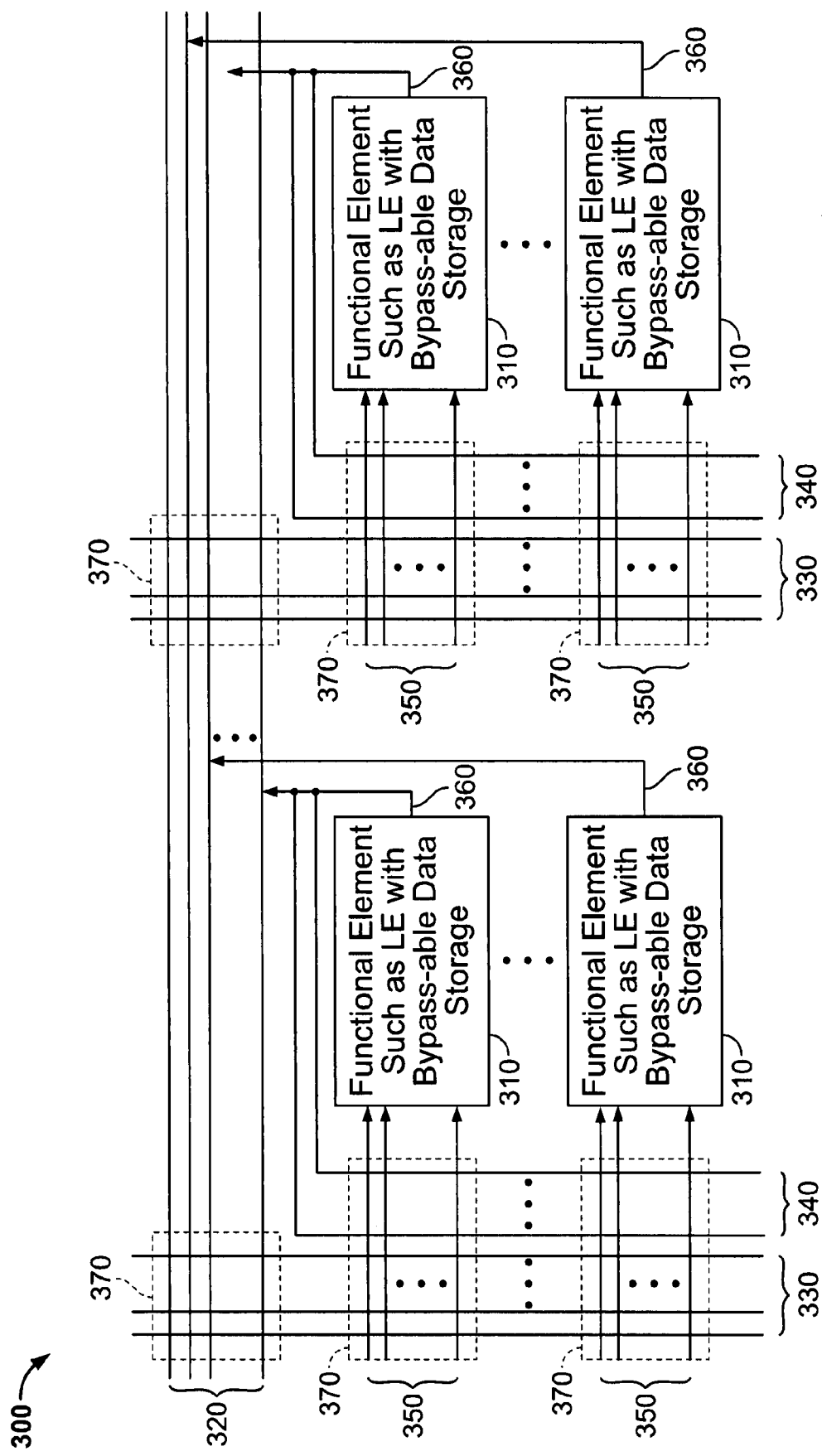
FIG. 6 is a simplified block diagram of an illustrative embodiment of more extensive circuitry that can be constructed to include the invention.

For completeness, FIG. 6 shows a representative portion of typical PLD circuitry 300 (implemented as an integrated circuit). FIG. 6 uses the more generic term "functional elements" for the circuit modules 310 that may be LEs and that may include bypassable data storage circuitry. Other examples of possible functional elements 310 are mentioned earlier in this specification and include memory blocks, DSP 00blocks, I/O blocks, etc. In keeping with the rest of this specification, it will generally be assumed that functional elements 310 are LEs, but one or more of them may be other types of circuit modules that are usable in implementations of the invention.

PLD 300 includes a large number of functional elements (e.g., LEs) 310, each including bypassable data storage circuitry (see also FIG. 7, which will be described in detail later). LEs 310 can be the same as LEs 22-28 and 32-38 in FIG. 1 or FIG. 3. In addition, because each LE 310 includes selectively usable data storage circuitry, LEs 310 can also be used to implement FFs 20, 30, and 40 in FIG. 1 or high- and low-phase latches 120, 125, 130, 135, and 140 in FIG. 3.

Figure 7:
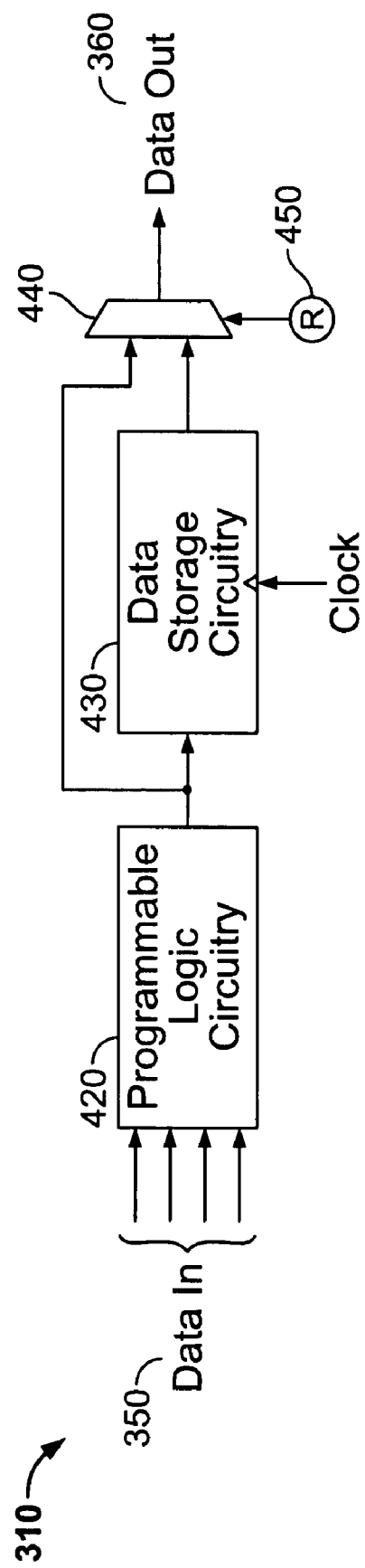
FIG. 7 is a simplified schematic block diagram of an illustrative embodiment of circuitry that can be used to implement portions of the FIG. 6 circuitry in accordance with the invention.

As shown in more detail in FIG. 7, in the illustrative case in which a functional element 310 in FIG. 6 is an LE, that element can include programmable logic circuitry 420 and data storage circuitry 430. Programmable logic circuitry 420 is programmable to perform any of several logic functions on one or more data signals 350 applied to that logic circuitry. The output signal of circuitry 420 can be registered by data storage circuitry 430 and then output via mux 440, or data circuitry 430 can be bypassed and the output signal of circuitry 420 can be output via mux 440 without being registered by circuitry 430. Mux 440 is controlled by programmable CRAM cell 450 to select which of its two inputs (registered or unregistered) it will output. Data storage circuitry 430 can be implemented as shown in FIG. 5 so that circuitry 430 can operate as either an edge-triggered flip-flop ("FF") or as a level-sensitive latch (either high or low phase).

Returning to FIG. 6, in addition to functional elements (e.g., LEs) 310, PLD circuitry 300 includes interconnection circuitry that is preferably at least partly programmable to convey signals to, from, and between LEs 310 in any of many different arrangements. Although this interconnection or routing circuitry may be provided in many different ways, in the particular example shown in FIG. 6, this circuitry includes horizontal conductors 320, vertical conductors 330, local feedback conductors 340, LE input conductors 350, and LE output conductors 360. Connections can be made between at least some of the conductors that cross one another within any of regions 370. Whether or not any particular one of such connections is made is determined programmably.

It will be apparent from the foregoing that with this type of circuitry the data storage element following any LE in FIG. 1 or FIG. 3 can be the data storage circuitry 430 associated with the programmable logic circuitry 420 of that LE. Also, with this type of circuitry FFs in a FIG. 1 type implementation can be converted to high-phase latches as in FIG. 3 just by changing the programming of the CRAMs 240 and 260 in the data storage circuitry of the LEs that provide that data storage function. And low-phase latches can be added as in FIG. 3 by enabling and appropriately programming the data storage circuitry of the LEs shown immediately upstream from those low-phase latches. With this type of embodiment it is not necessary to change any of the inter-LE routing (FIG. 6) to go from a FIG. 1 type implementation of a given logic design to a FIG. 3 type implementation of that logic or vice versa. (Possible exceptions to this are for registers implemented in so-called "lonely register mode." This is a register in an LE that is used substantially independently of the combinational logic 420 in that LE, which combinational logic is also in use. In such cases some register functionality may need to be relocated, which can necessitate re-routing some signals on the PLD.) Moreover, if it is desired to do so, some parts of a given logic design can be implemented using single-phase, edge-triggered FFs, while other parts of that design are implemented (on the same integrated circuit and in the same basic PLD organization or architecture) using two-phase, level-sensitive latches. Or 100% of a design may be latch-based as described herein.

Figure 8:
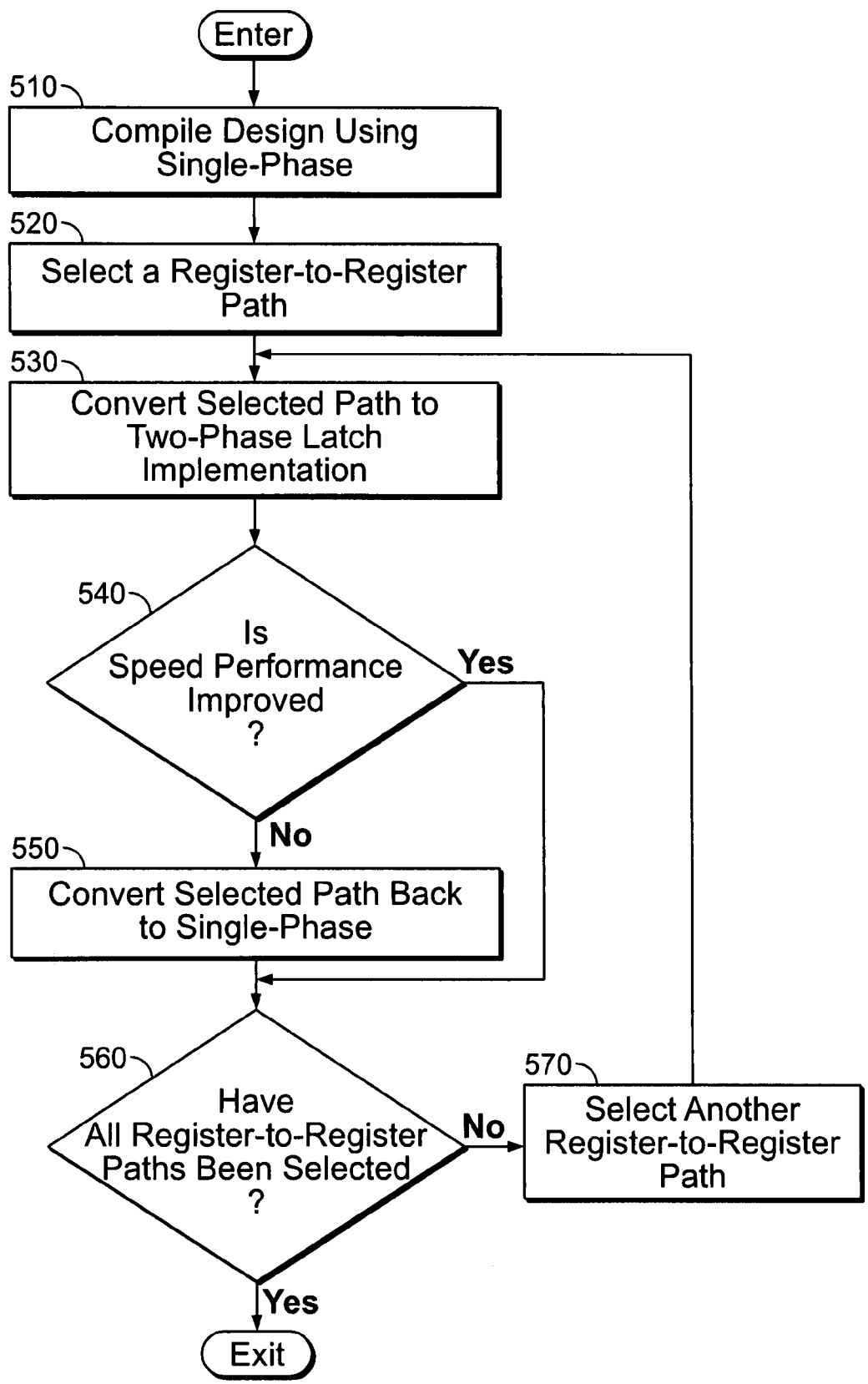
FIG. 8 is a simplified flow chart illustrating an embodiment of certain aspects of the invention.

Another possible aspect of the invention relates to implementing a user's logic design with two-phase, level-sensitive latches as described above so as to improve the speed performance of the design. An illustrative embodiment of this aspect of the invention is shown in FIG. 8, which will now be described.

In step 510 the user's logic design is compiled in the conventional way for implementation in the conventional way using single-phase, edge-triggered flip-flops (e.g., as in FIG. 1).

In step 520 a register-to-register path in the design from step 510 is selected for consideration. Such a path is not necessarily one between two immediately neighboring registers (e.g., from FF 20 to FF 30 in FIG. 1, or from FF 30 to FF 40 in that FIG.), but may be a path that extends through one or more intervening registers (e.g., from FF 20 to FF 40 in FIG. 1).

In step 530 the register-to-register path selected in step 520 is converted to a two-phase latch implementation (e.g., as in FIG. 3). This can be done in any of several ways, but a currently preferred way is to convert each FF in the path to a latch of one phase and to insert latches of the other phase in the logic between each adjacent pair of the first phase latches. For example, as illustrated by the conversion of the FIG. 1 circuitry to the FIG. 3 form, each FIG. 1 FF is converted to a FIG. 3 high-phase latch, and a low-phase latch is added in the logic between each pair of adjacent high-phase latches. The latches that are added can be inserted at various points, but it is generally desirable to add them where they split (subdivide) the propagation delay or time between adjacent latches that are the result of FF conversions. If the logic flow between the former FFs is more complicated than is shown in FIGS. 1 and 3, then it may be necessary to add more than one latch (e.g., more than one low-phase latch) between the latches that result from FF conversions. An example of this is shown in FIGS. 12-16 and discussed more extensively later in this specification.

In step 540 the design that includes the path conversion from step 530 is analyzed for operating speed capability. If the path conversion from step 530 is found to improve the operating speed of the design, that conversion is retained in the redesign of the logic that is being created, and control passes from step 540 to step 560. If in step 540 the path conversion from step 530 is found not to improve the operating speed of the design, then step 550 is performed to undo the conversion that was from the last performance of step 530, and control then passes to step 560.

Step 560 determines whether all register-to-register paths in the user's design have been considered. If so, the redesign for latch implementation is complete and the redesign process is exited. If not, step 570 is performed to select another register-to-register path for consideration, and control then returns to step 530 to repeat that step and subsequent steps as described above.

It may not be possible to improve the speed performance of every user design by employing this invention (e.g., by converting some or all of the user's design from single-phase, edge-triggered FF data storage to two-phase, level-sensitive latch data storage, for example, by using the redesign technique shown in FIG. 8). If no improvement is possible, then the user's design can be left alone and implemented using single-phase, edge-triggered FFs. On the other hand, if the speed performance of a user's design is improved by implementing it in whole or in part using two-phase, level-sensitive latches, then the design can be implemented in that way and it can thereby be made to operate faster than it otherwise would.

As an optional adjunct to converting FFs to high-phase latches (with low-phase latches placed later in the logic), methods in accordance with the invention may also include consideration of register retiming. This involves moving logic that is initially located after a latch to a location preceding the latch, or moving logic that is initially located before a latch to a location after the latch. The purpose of such register retiming is to attempt to improve timing for the new latch implementation.

Figure 9:
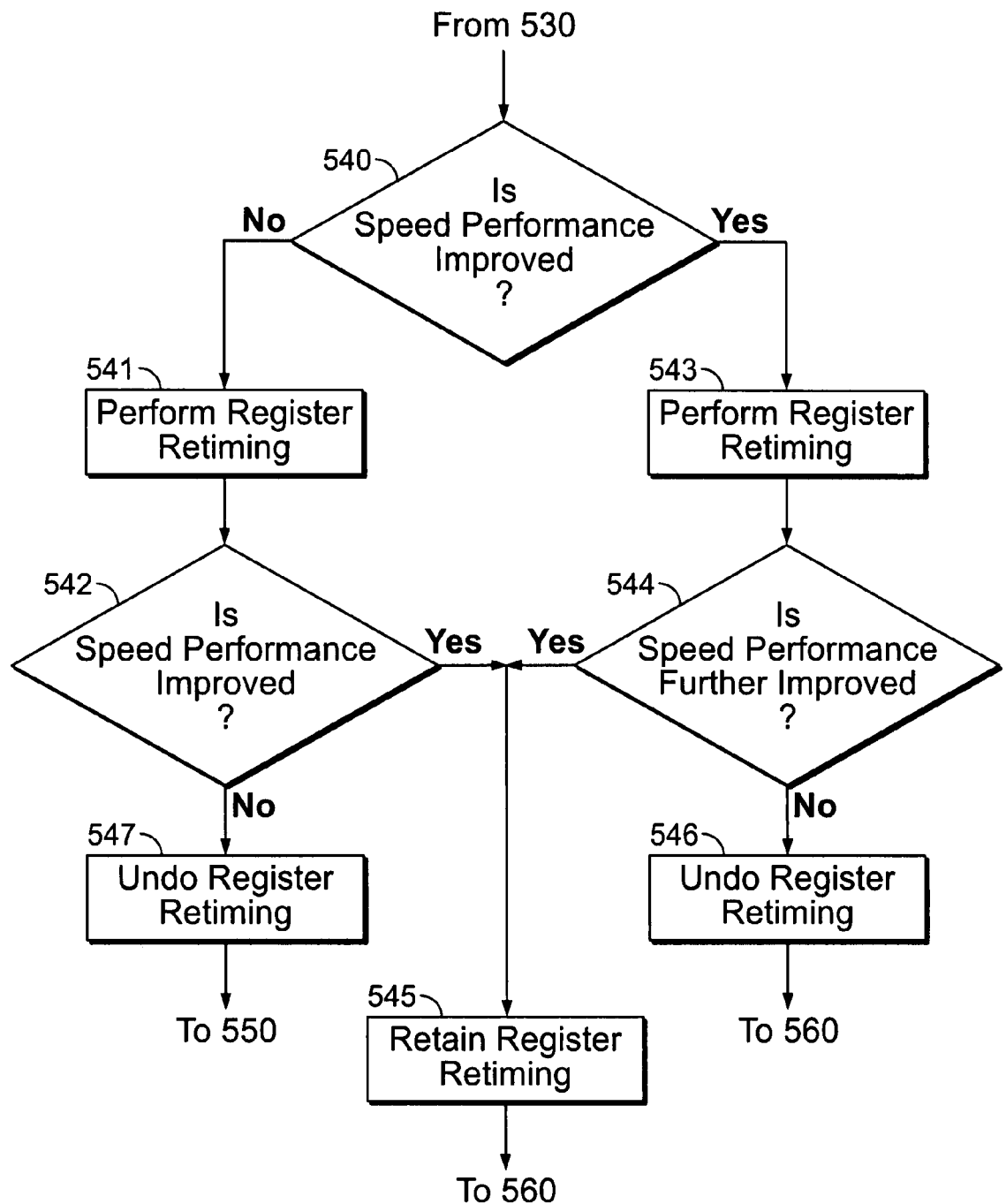
FIG. 9 is a simplified flow chart illustrating an embodiment of an optional feature of the invention.

FIG. 9 shows illustrative modification of method steps like those in FIG. 8 to include the option of register retiming as mentioned in the preceding paragraph. Step 540 in FIG. 9 is the same as step 540 in FIG. 8. But in FIG. 9 the "NO" output from step 540 leads to step 541, and the "YES" output leads to step 543. In step 541 register retiming is performed as described in the preceding paragraph. Step 541 may embody several different register retiming trials, with the best trial being the one finally selected for consideration in succeeding step 542. In step 542 the register retiming from step 541 is tested to determine whether speed performance is improved (as compared to speed performance prior to conversion of FFs to latches in step 530). If speed performance is still not improved, even by the register retiming performed in step 541, the register retiming is undone in step 547, and step 550 (FIG. 8) is performed to convert the path being worked on back to single-phase FFs. On the other hand, if step 542 shows improved speed performance, then step 545 is performed to retain the conversion to two-phase latches with register retiming. Step 560 (FIG. 8) follows.

Turning now to the "YES" output from step 540, step 543 is similar to step 541. Again, the best result obtained in step 543 is the one considered in step 544, which is similar to step 542. The "YES" output from step 544 leads to above-described step 545, whereby the conversion to two-phase latches with register retiming is retained, and step 560 follows. The "NO" output from step 544 leads to step 546, in which the register retiming is undone, but the conversion to two-phase latches is retained. Step 560 follows.

Figure 10:
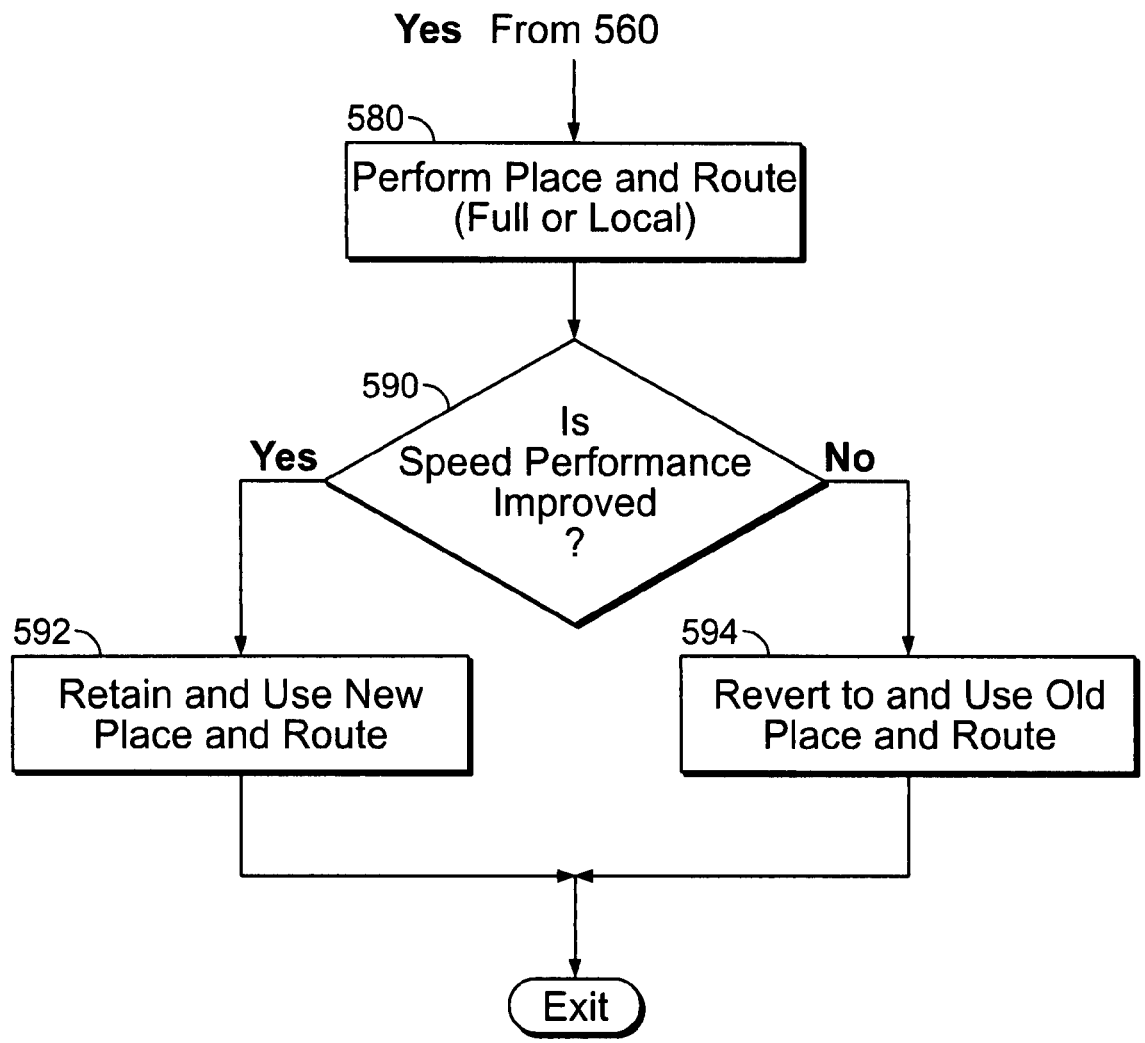
FIG. 10 is a simplified flow chart illustrating an embodiment of another optional feature of the invention.

Another step that may be optionally performed in accordance with the invention in an effort to further improve timing is a place and route step performed on a design that results from conversion from FFs to two-phase latches. A place and route step can be per se conventional. It makes a final determination of where each element of logic, etc., in a design will be located on the PLD and how those various elements will be connected to one another. FIG. 10 shows an example of how a place and route step can be added to what is shown in FIG. 8 (with or without the features shown in FIG. 9). As shown in FIG. 10, place and route step 580 follows the "YES" output from step 560. The place and route of step 580 is, of course, performed only if at least some of the original FF design has been converted to a two-phase latch design (e.g., as in step 530 (and not reversed in step 550) for at least some paths). Place and route step 530 may be performed on the entire new design that includes two-phase latches, or it may be performed on only parts of the new design (e.g., the parts of the new design in which two-phase latches are employed). Following step 580, step 590 is performed to determine whether the results of the step 580 place and route lead to improved speed performance of the circuitry as compared to the original place and route results. If so, step 592 is performed to retain the new place and route results and the depicted method is exited. If the new place and route does not improve speed performance, then step 594 is to revert to the original place and route results, and the depicted method is then exited.

Although some embodiments of the invention can avoid or largely avoid changing component utilization and signal routing when converting from FFs to two-phase latches, embodiments that include optional features like those shown in FIG. 9 and/or FIG. 10 tend to cause at least some changes in component utilization and signal routing (assuming that steps like 545 in FIG. 9 and/or 592 in FIG. 10 are performed).

Figure 11A:
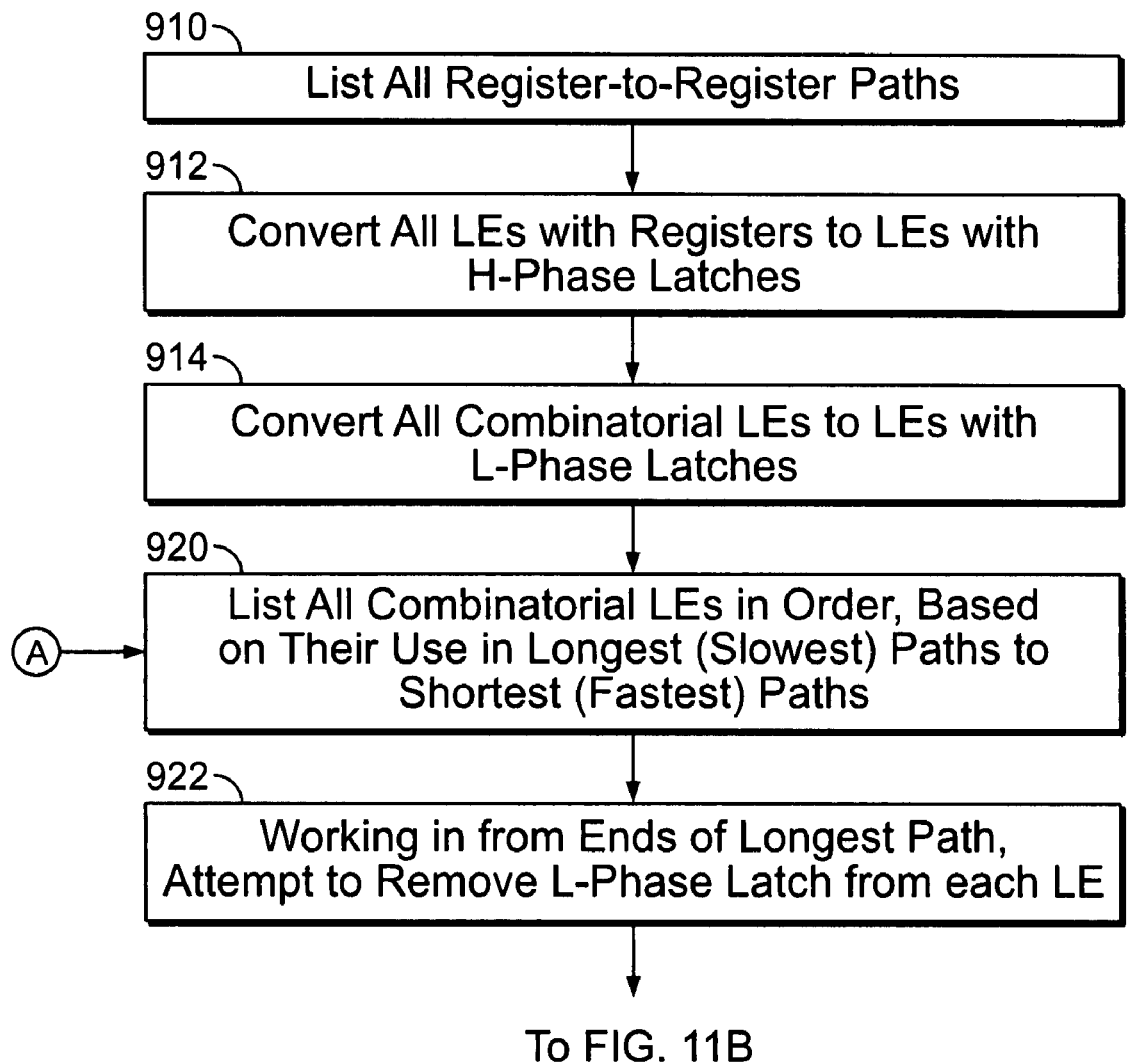
FIGS. 11a and 11b are collectively a more detailed (but still simplified) flow chart of an illustrative embodiment of certain aspects of the invention.
Figure 11B:
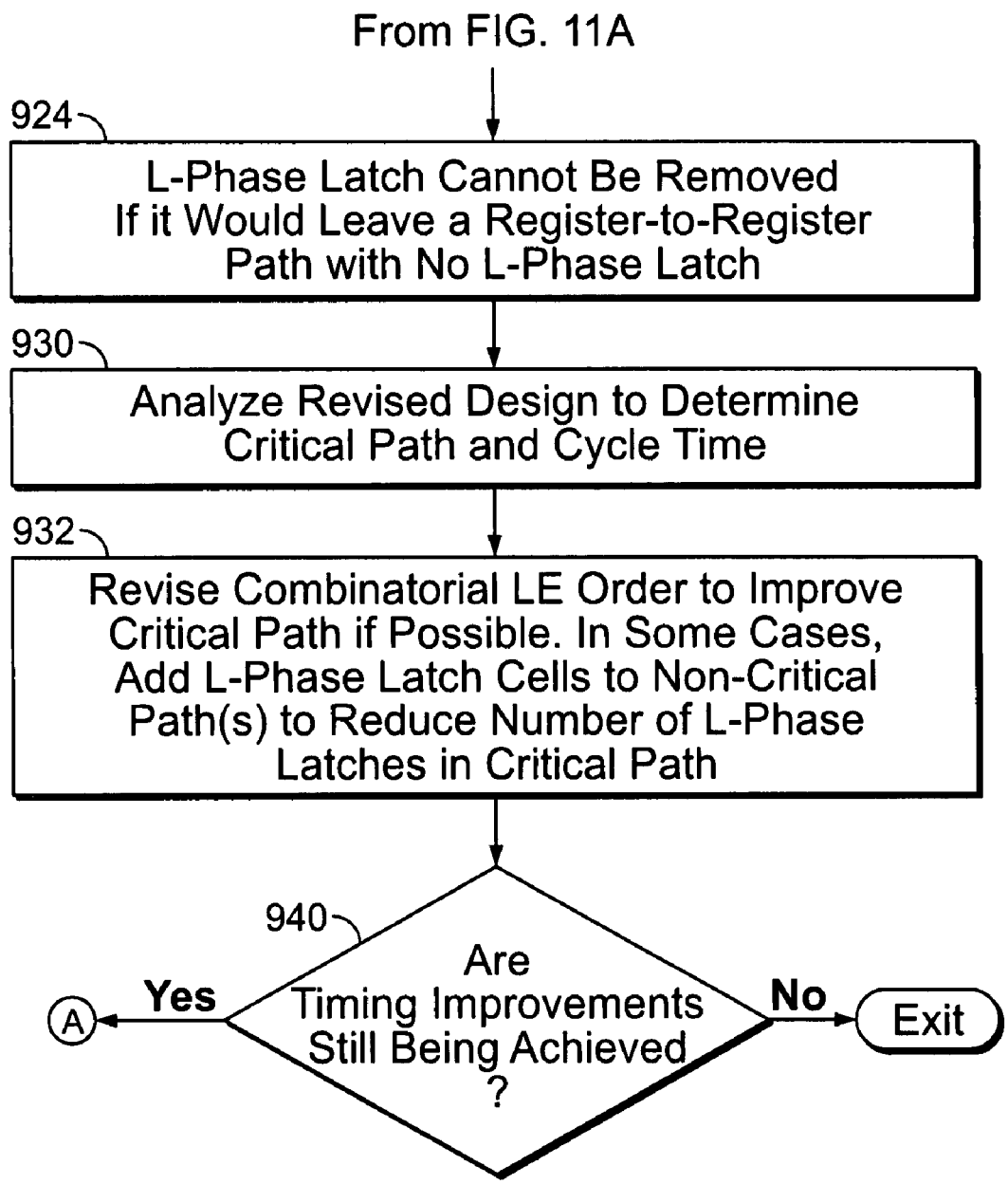
Figure 12:
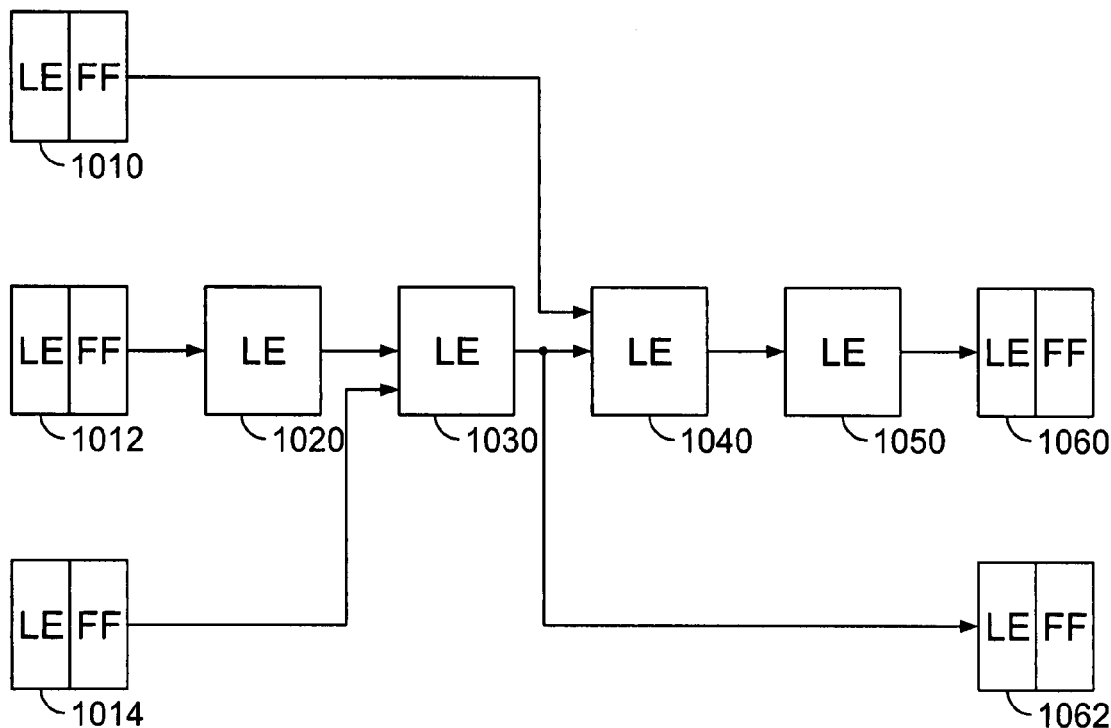
FIG. 12 is a simplified block diagram of illustrative circuitry that can be modified in accordance with the invention.

A somewhat more detailed illustrative embodiment of what can be portions of FIG. 8 is shown in FIGS. 11a and 11b. An example of circuitry on which the steps in FIGS. 11a and 11b may be performed is shown in FIGS. 12-16. In step 910 (FIG. 11a) all register-to-register paths in a design (e.g., from step 510 in FIG. 8) are listed. FIG. 12 is an example of circuitry including such register-to-register paths. This is circuitry that basically extends from the registers ("FFs") in upstream LEs 1010, 1012, and 1014 to the registers in downstream LEs 1060 and 1062. Intervening combinational LEs 1020, 1030, 1040, and 1050 additionally operate on various signals passing from the upstream registers to the downstream registers.

Figure 13:
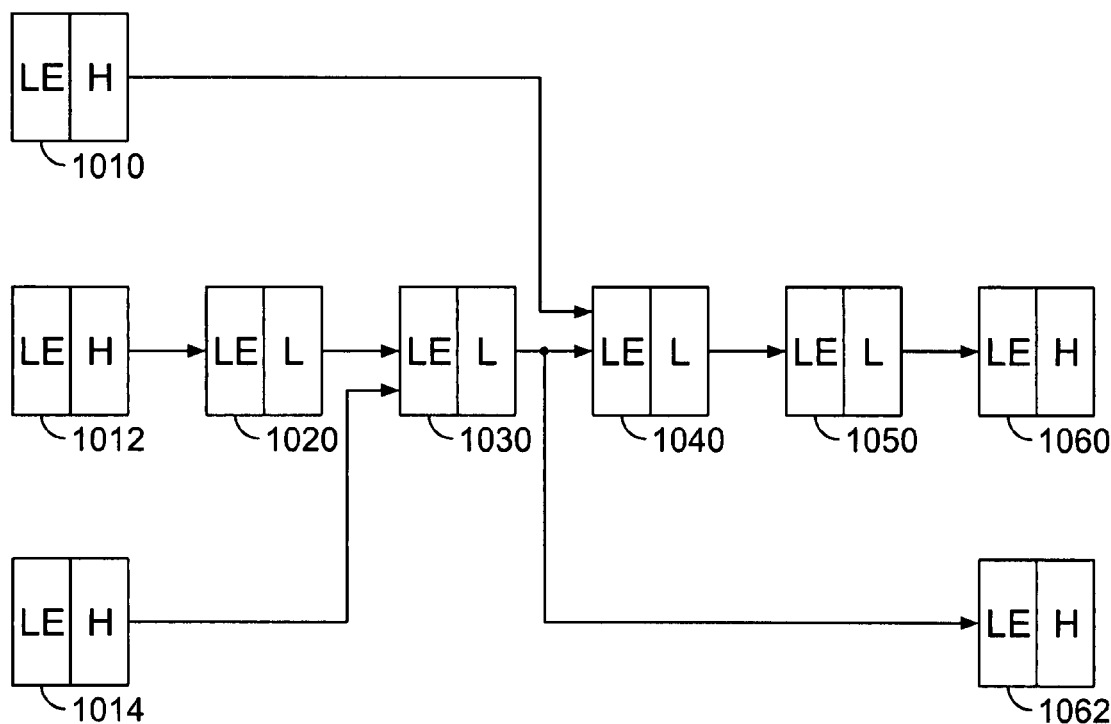
FIG. 13 is similar to FIG. 12, and shows an early stage or step in modifying the FIG. 12 circuitry in accordance with an illustrative embodiment of the invention.

In step 912 (FIG. 11a) all of the LEs with registers are converted to LEs with high-phase ("H-phase") latches, and in step 914 all combinational LEs are converted to LEs with low-phase ("L-phase") latches. This is illustrated by FIG. 13, in which all of LEs 1010, 1012, 1014, 1060, and 1062 from FIG. 12 are now shown with H-phase latches, and all of LEs 1020, 1030, 1040, and 1050 are shown with L-phase latches. As in all other cases throughout this specification, the use of H-phase latches to replace flip-flops ("FFs") and the use of L-phase latches between the H-phase latches is purely a matter of design choice, and the opposite choice could be made instead if desired (i.e., replacement of FFs with L-phase latches, and use of H-phase latches between the L-phase latches).

In step 920 all of the combinatorial LEs (e.g., like LEs 1020, 1030, 1040, and 1050 in FIG. 11) are listed in order based on their use in the longest to shortest paths. This is done so that the longest (slowest) path can be worked on first in the succeeding steps. It is assumed in the following discussion that the circuitry shown in FIG. 13 is found to include the longest path in the design.

Figure 14:
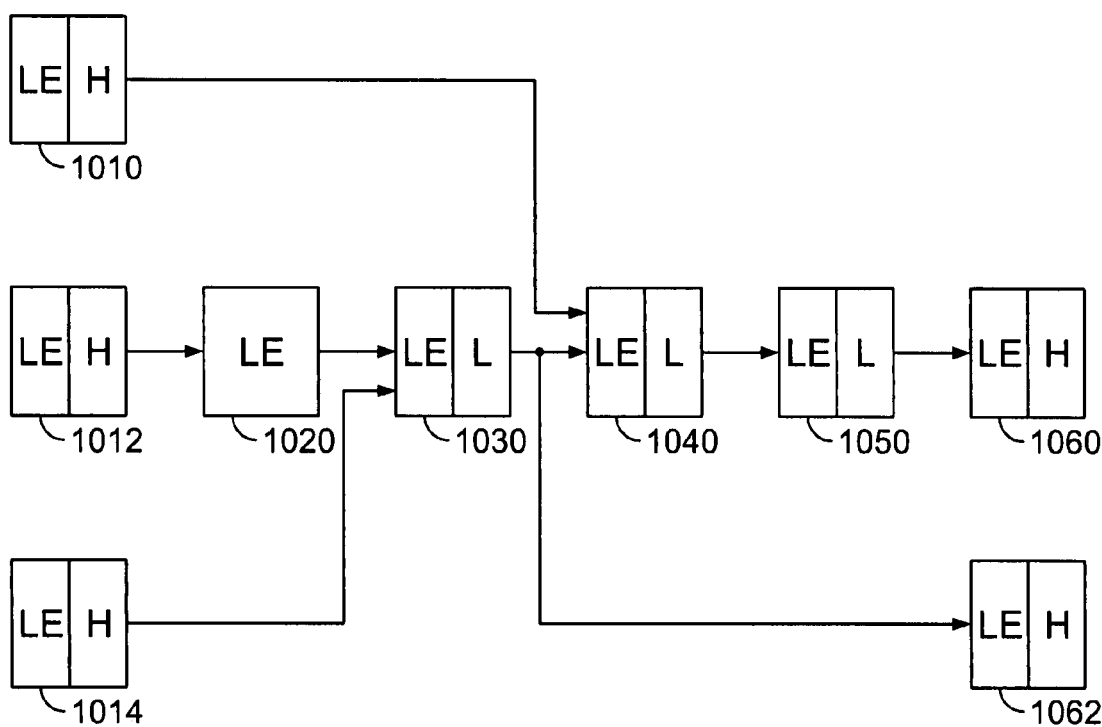
FIGS. 14-16 are similar to FIG. 13, and show subsequent stages or steps in modifying the FIG. 12 circuitry in accordance with an illustrative embodiment of the invention.

In step 922 attempts are made to remove as many L-phase latches as possible from the longest path. This is done by working in from the ends of the longest path. In FIG. 14, for example, it is found possible to remove the L-phase latch from L 1020. Step 924 states the rule that there must always be at least one L-phase latch between upstream and downstream H-phase latches. The L-phase latch can be removed from LE 1020 because doing so does not violate the step 924 rule.

Figure 15:
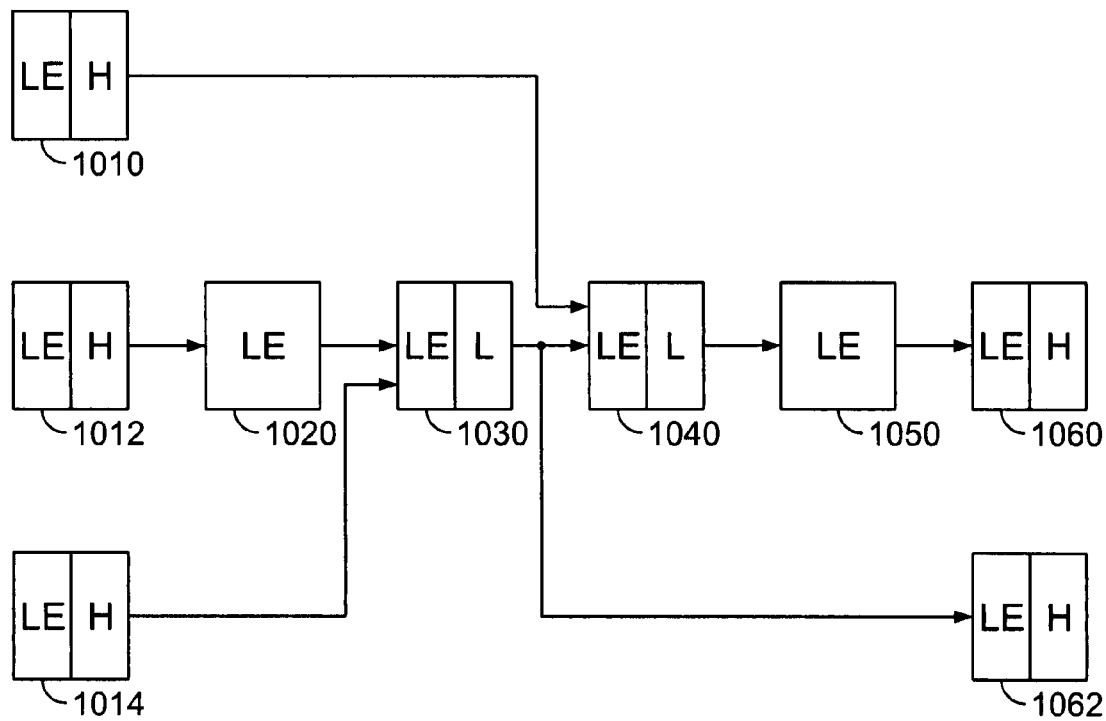

In FIG. 15 it is found possible to also remove the L-phase latch from LE 1050 because this again does not violate the rule of step 924. However, neither of the L-phase latches in LEs 1030 and 1040 can be removed. The L-phase latch in LE 1030 is needed, for example, between the upstream H-phase latch in LE 1014 and the downstream H-phase latch in LE 1062, and the L-phase latch in LE 1040 is needed, for example, between the upstream H-phase latch in LE 1010 and the downstream H-phase latch in LE 1060. It is desirable to remove as many L-phase latches as possible because there is some signal propagation delay associated with each such latch and for other reasons that will become clearer as the discussion proceeds. It is preferable to work in from both ends of a path in removing L-phase latches because it is desirable for the L-phase latches (one or more) that remain in a path to split the delay of that path as nearly equally as possible. FIG. 15 shows the final result of performing steps 922 and 924 on the illustrative circuitry being considered.

Figure 16:
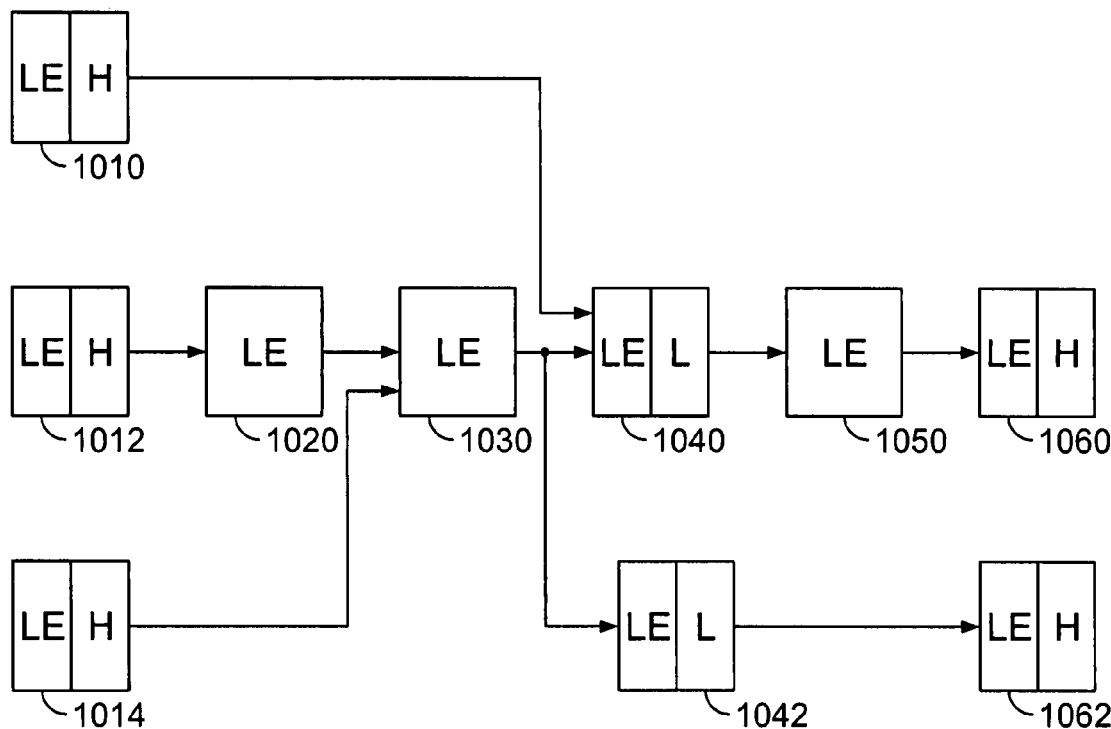

In step 930 the revised design is analyzed to determine the possibly new critical path and cycle time. In step 932 the order of LEs in what is now found to be the critical path may be re-ordered if that will improve performance of the critical path. Also in step 932 consideration is given to moving any extra L-phase latches in the critical path to non-critical paths. FIG. 16 shows an example of this last point. The FIG. 15 path that includes all of LEs 1020, 1030, 1040, and 1050 tends to be more critical than other paths in that FIG. Thus the presence of two L-phase latches in series in that path tends to be somewhat undesirable. FIG. 16 shows that the L-phase latch from LE 1030 an be moved to an LE 1042 that is added between LEs 1030 and 1062. The logic in LE 1042 is not used for anything (at least not in the depicted path(s)). Only the L-phase latch capability of that LE is used in the depicted path(s). Addition of LE 1042 in this way to a non-critical path prevents the rule of step 924 from being violated, while at the same time allowing an L-phase latch that is "extra" in the critical path to be removed from that path. This speeds up the critical path and frees up more time for borrowing along that path. (In connection with FIG. 16 it should be mentioned that if the LEs in the device have "lonely register" capability (as in desirable and as is described earlier in this specification), then the combinational logic of LE 1042 may be in use in some other path(s) not depicted in FIG. 16, while the lonely register capability of LE 1042 is taken over for use as shown in FIG. 16. Alternatively, LE 1042 may be an LE that is truly not in use for any other purpose than as shown in FIG. 16. It is not uncommon for a substantial number of the registers in a PLD to be unused in most uses of the PLD, and therefore many registers tend to be available for use as shown in FIG. 1. For example, it is quite common for about 50% of the registers in a PLD to be unused in many uses of the PLD.)

Step 940 is performed to make sure the process will end when iterations of the preceding steps are no longer achieving timing improvements. If timing improvements are still being achieved, control passes from step 940 back to step 920 where the combinational LEs are again reordered to find the remaining longest path for consideration in the next iteration of the succeeding steps. The process is exited when timing improvements are no longer being achieved or when timing goals are met.

Figure 17:
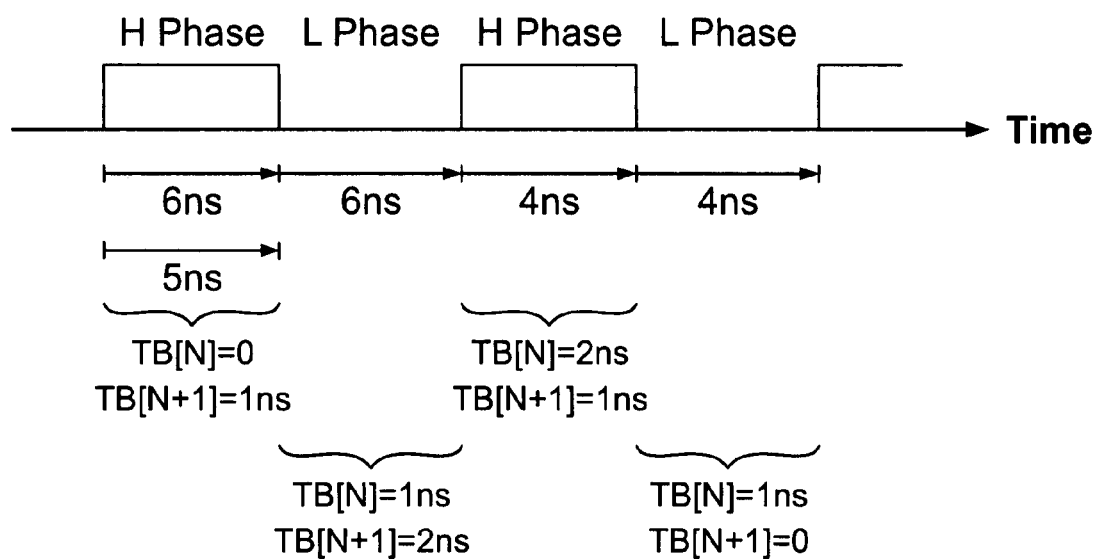
FIG. 17 is a simplified signal waveform with annotations that are useful in explaining and characterizing certain principles of the invention.
Figure 18:
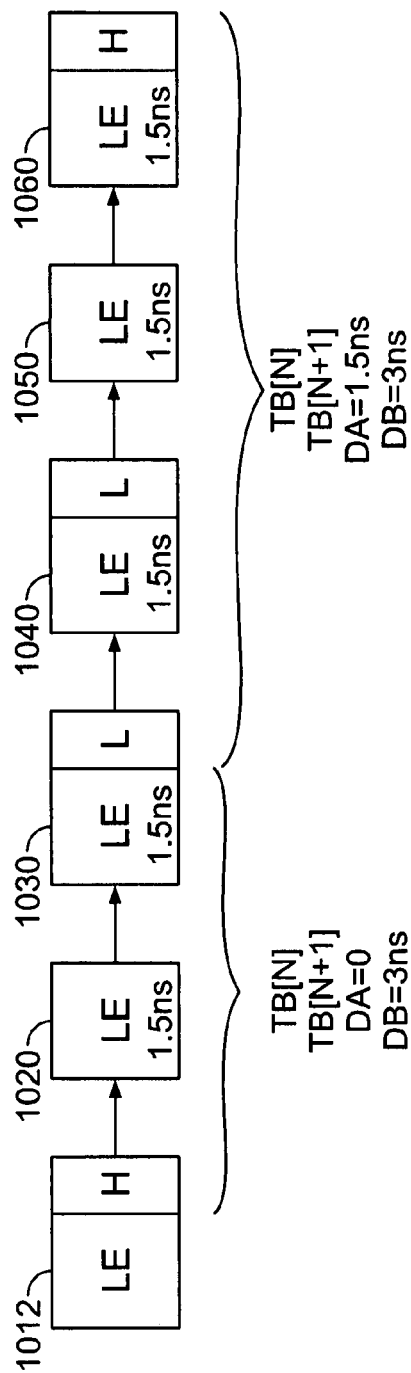
FIG. 18 is similar to a portion of FIG. 15 with annotations that are useful in explaining and characterizing certain principles of the invention.

FIGS. 17 and 18 illustrate some terminology that is useful in explaining certain underlying principles of the invention. (The nomenclature is consistent among these FIGS., but the particular numerical examples are not necessarily consistent.) FIG. 17 repeats the illustrative example shown in FIG. 4 with some notations added. In FIG. 17 each high or low phase of the clock signal has two parameters associated with it. These are TB[N] (time borrowed from this phase by the logic of the preceding phase or phases) and TB[N+1] (time borrowed by the logic of this phase from the succeeding phase or phases). For the first (left-most) H phase TB[N] is assumed to be 0. In other words, it is assumed that no time has been borrowed from this phase by any preceding phase or phases. TB[N+1] for the first H-phase is 1 ns because it takes 6 ns for a signal to propagate through LEs 22 and 24 (FIG. 3) from high-phase latch 120 to low-phase latch 125, and because half a clock cycle is only 5 ns. It is therefore necessary for the logic 22 and 24 of the first high phase to effectively "borrow" 1 ns from the succeeding low phase.

Turning now to the first low phase in FIG. 17, TB[N] for that phase is TB[N+1] from the preceding high phase, i.e., 1 ns. In other words, the parameter TB[N] recognizes that 1 ns has already been borrowed from this L phase by the preceding H phase. This already borrowed 1 ns is not available to the logic 26/28 (FIG. 3) of the L phase for propagation of a signal through that logic. Nevertheless it takes 6 ns for a signal to propagate through that logic 26/28. The first L phase must therefore borrow 2 ns from the succeeding H phase. TB[N+1] for the first L phase is therefore 2 ns as shown in FIG. 17.

Now considering the next H phase in FIG. 17, TB[N] for that phase is TB[N+1] from the preceding low phase, i.e., 2 ns. This recognizes that 2 ns has already been borrowed from this H phase by the preceding phases. This reduces the time available for signal propagation through logic 32/34 (FIG. 3) by 2 ns. However, logic 32/34 only requires 4 ns for signal propagation, so only 1 ns needs to be borrowed by this H phase from the succeeding L phase. TB[N+1] for the second H phase is therefore 1 ns.

From the foregoing it will now be apparent why, for the second L phase, TB[N]=1 ns and TB[N+1]=0.

Using the above nomenclature, the following considerations govern borrowing time between phases. In analyzing the timing for each phase (high or low), an amount of time can be borrowed from succeeding phases. However, there is a limit to how much time can be borrowed within each phase; and because borrowed time accumulates, there is a limit to how much cumulative time can be borrowed in any stretch of borrowing. To perform timing analysis on a circuit, the timing tool must keep track of how much accumulated time is being borrowed in each phase.

One basic rule that must be observed is:

$$TB[N]+DA \leq 0.5TC, \quad (1)$$

where TC is the period of the clock signal (a 50% duty cycle being assumed), and where DA is the amount of time between any more than one of the same-phase latches that exist in the circuitry being considered. The parameter DA may be better understood from the following discussions of FIG. 18.

FIG. 18 repeats the illustrative horizontal signal path shown in FIG. 15 with some delay values and other notations added. FIG. 18 shows (by the curly braces) where the boundaries between succeeding high and low phases are found in this circuitry. In any phase, DA is the delay between same-phase latches in that phase. There are no same phase latches in the high-phase circuitry on the left, so DA for that high-phase circuitry is 0. But the low phase circuitry on the right has two low-phase latches (in LEs 1030 and 1040) with a delay of 1.5 ns between them. DA for this low-phase circuitry is therefore 1.5 ns.

With the foregoing in mind, it will be understood that relationship (1) is basically a constraint on how much time can be borrowed from any phase. Relationship (1) says that the amount of time that can be borrowed (TB[N]) plus DA cannot be greater than 0.5TC. This shows the desirability of reducing (preferably to one) the number of same-phase latches in each phase. If the number of same phase latches can be reduced to one, DA becomes 0, which increases the amount of time that can be borrowed from that phase. On the other hand, if a phase has more than one same-phase latch, the data has to propagate through all of the same-phase latches before these latches can close. Otherwise the data will get "stuck" in these latches and not be able to propagate to the next latch. Assuming a 50% duty cycle, the amount of time for each phase is one-half the cycle time. If there is time borrowed in a given phase for the previous phase, then this means that the data will not be ready at the first latch until some time later. This amount of time is the time that has been borrowed. So this constraint (relationship (1)) is saying essentially that the data has to make it to the last of the same-phase latches before the last same-phase latch cuts off, which will occur at 0.5TC. Relationship (1) therefore means that having DA=0 provides the most amount of accumulated time borrowing, which is 0.5TC. This is why it is preferable to have only one same-phase latch.

Another timing constraint is the following:

$$TB[N+1] \leq 0.5TC. \qquad (2)$$

This constraint is placing a limit on how much time borrowing can be accumulated. It is not possible to borrow more than one-half cycle because data must propagate through the next phase latch, which will cut off at 0.5TC. This is similar to the previous constraint, but less restrictive because it doesn't consider the DA from the next cycle yet. For a given phase this constraint may be met, only to have the previous constraint not met because DA is not equal to 0.

Another timing relationship that must be satisfied is:

$$TB[N+1]=(TB[N]+DA+DB)-0.5TC, \qquad (3)$$

where DB is the time delay to the first next-phase latch (see FIG. 18 for some examples). This equation calculates how much time is being borrowed going into the next phase. For each phase the budgeted time is 0.5TC. Adding how much was previously borrowed (TB[N]) plus the time between the same phase latches (DA) plus the time to the first next-phase latch (DB) is the amount of time that has been used in a given phase. So subtracting 0.5TC from this amount will determine how much time is being borrowed from the next phase. In doing timing analysis this last equation (3) is used for each phase to determine the amount of time borrowing per phase. The first two constraints (1) and (2) are constraints on the derived borrowed time, which must be met for each phase. If either of these two constraints are not met, then the circuit will fail due to timing.

Figure 19:
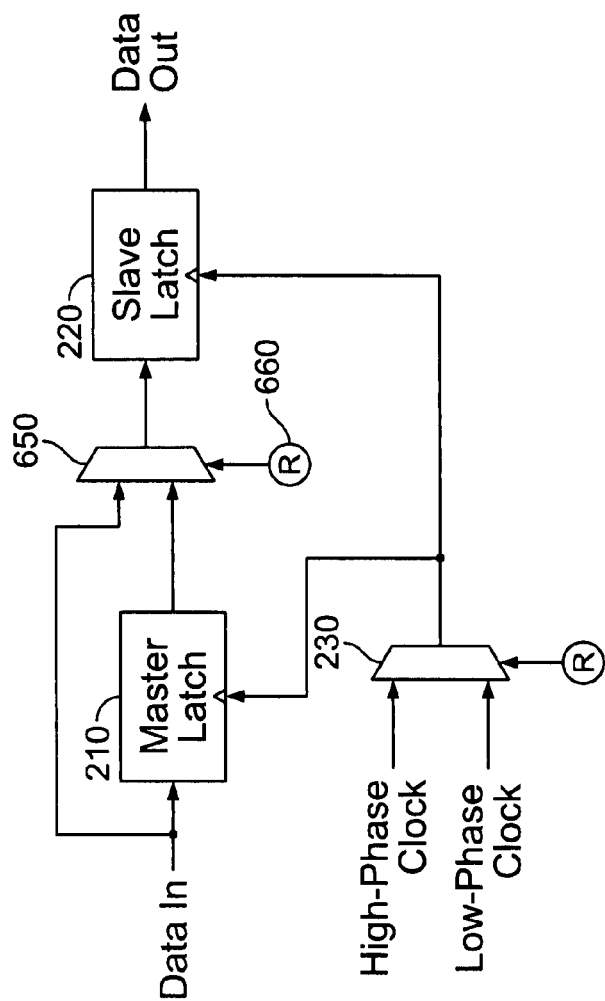
FIGS. 19-23 are generally similar to FIG. 5, but show various alternative embodiments in accordance with the invention.
Figure 20:
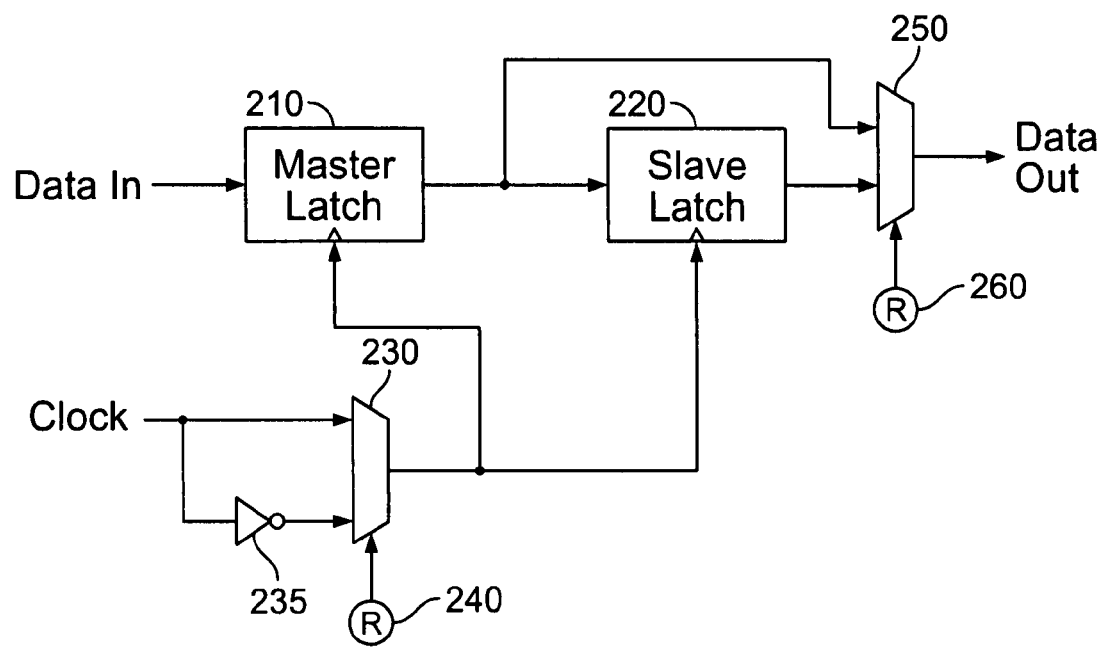
Figure 21:
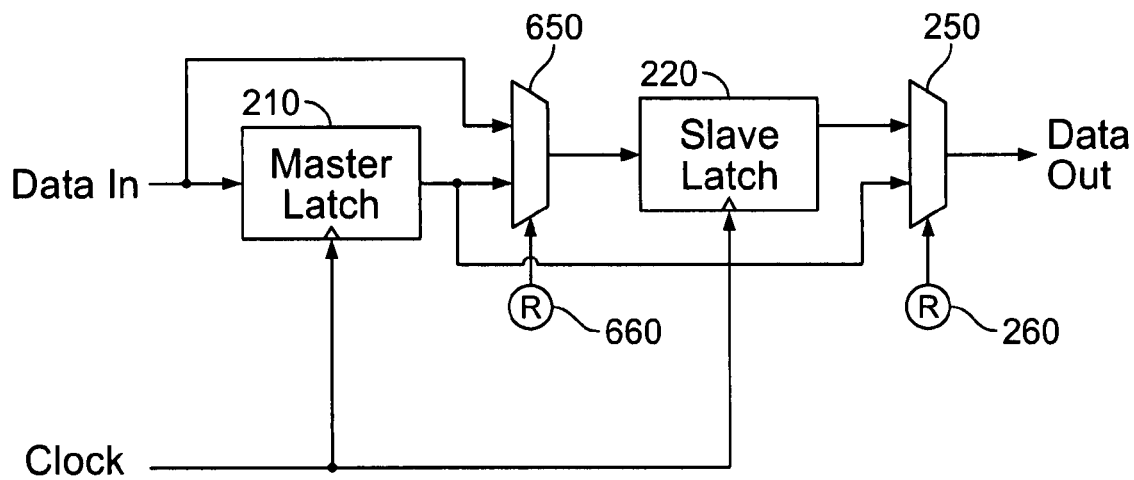

It will be understood that the foregoing is only illustrative of the principles of the invention, and that various modifications can be made by those skilled in the art without departing from the scope and spirit of the invention. For example, although FIG. 5 shows conversion of an M-S FF to a level-sensitive latch by bypassing the slave latch, a similar result can be achieved by instead bypassing the master latch and using only the slave latch. FIG. 19 shows an example of how this can be done, using elements 650 and 660 to selectively bypass master latch 210. FIG. 20 shows an example of how either a high- or low-phase clock signal can be generated from a single reference clock signal. In FIG. 20 mux 230 (controlled by CRAM 240) selects either the single applied clock signal itself or the complement of that signal (produced by inverter 235) as the clock signal to be used to clock latches 210/220. FIG. 21 shows an example of how the inherent opposite-phase responsiveness of latches 210 and 220 can be used to provide either a high-phase latch or a low-phase latch without any manipulation of the clock signal(s). For example, if master latch 210 is inherently responsive when the clock signal is low, the circuitry of FIG. 21 can perform as a low-phase latch by using element 250 and 260 to bypass slave latch 220, thereby effectively leaving only master latch 210 in the circuit as a low-phase latch. On the same set of assumptions, slave latch 220 is inherently responsive when the clock signal is high. The circuitry of FIG. 21 can therefore perform as a high-phase latch by using elements 650 and 660 to bypass master latch 210. This effectively leaves only slave latch 220 in the circuit as a high-phase latch.

Figure 22:
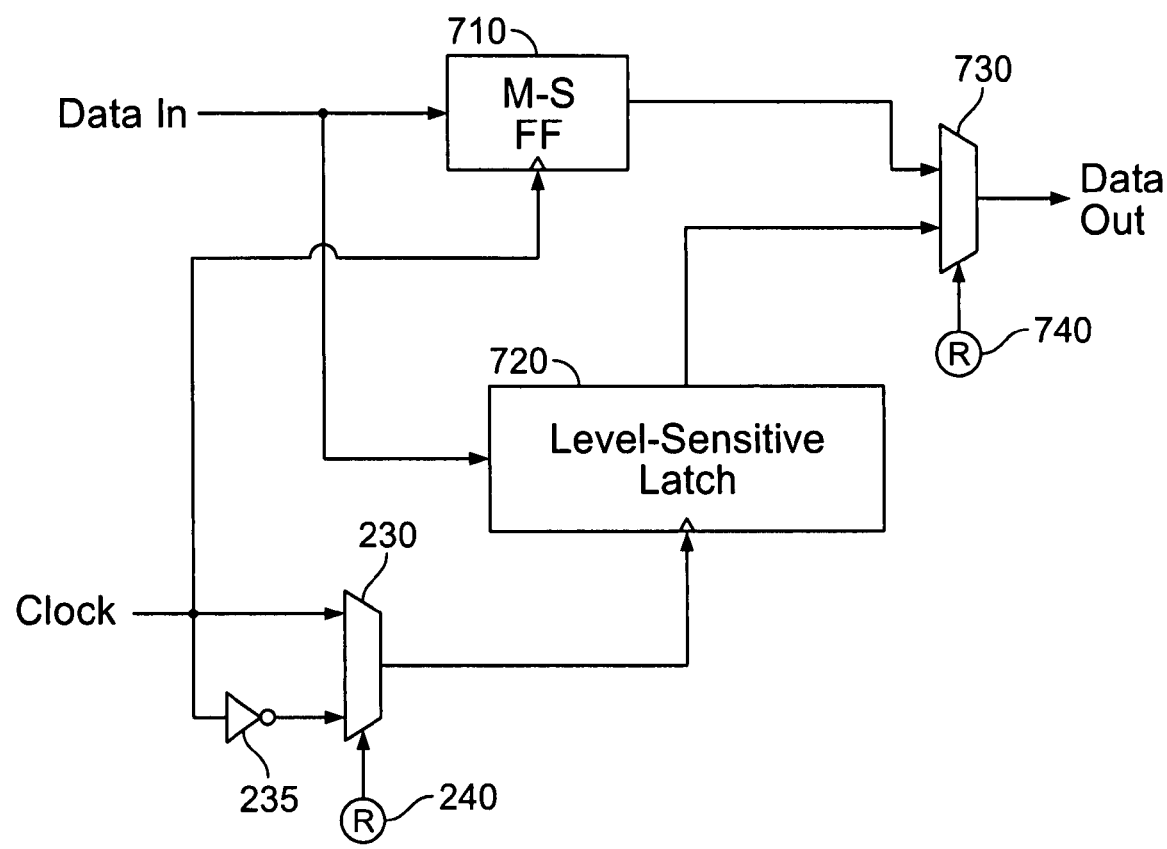

Another way the data storage circuitry of an LE can be made to implement either an M-S FF or a level-sensitive latch is by including in that circuitry both forms of such data storage, together with programmable routing circuitry for allowing either data storage form to be used. An illustrative example of this is shown in FIG. 22, in which both M-S FF 710 and level-sensitive latch 720 are provided. The data input signal is applied to both of these subcircuits, and elements 730 and 740 (respectively similar, for example, to elements 250 and 260 in FIG. 21) allow the output signal of either of these subcircuits to be the data output signal. Latch circuitry 720 is operable on either the high or low phase of the clock signal through the use of elements 230, 235, and 240 (similar to what is shown in FIG. 20).

Figure 23:
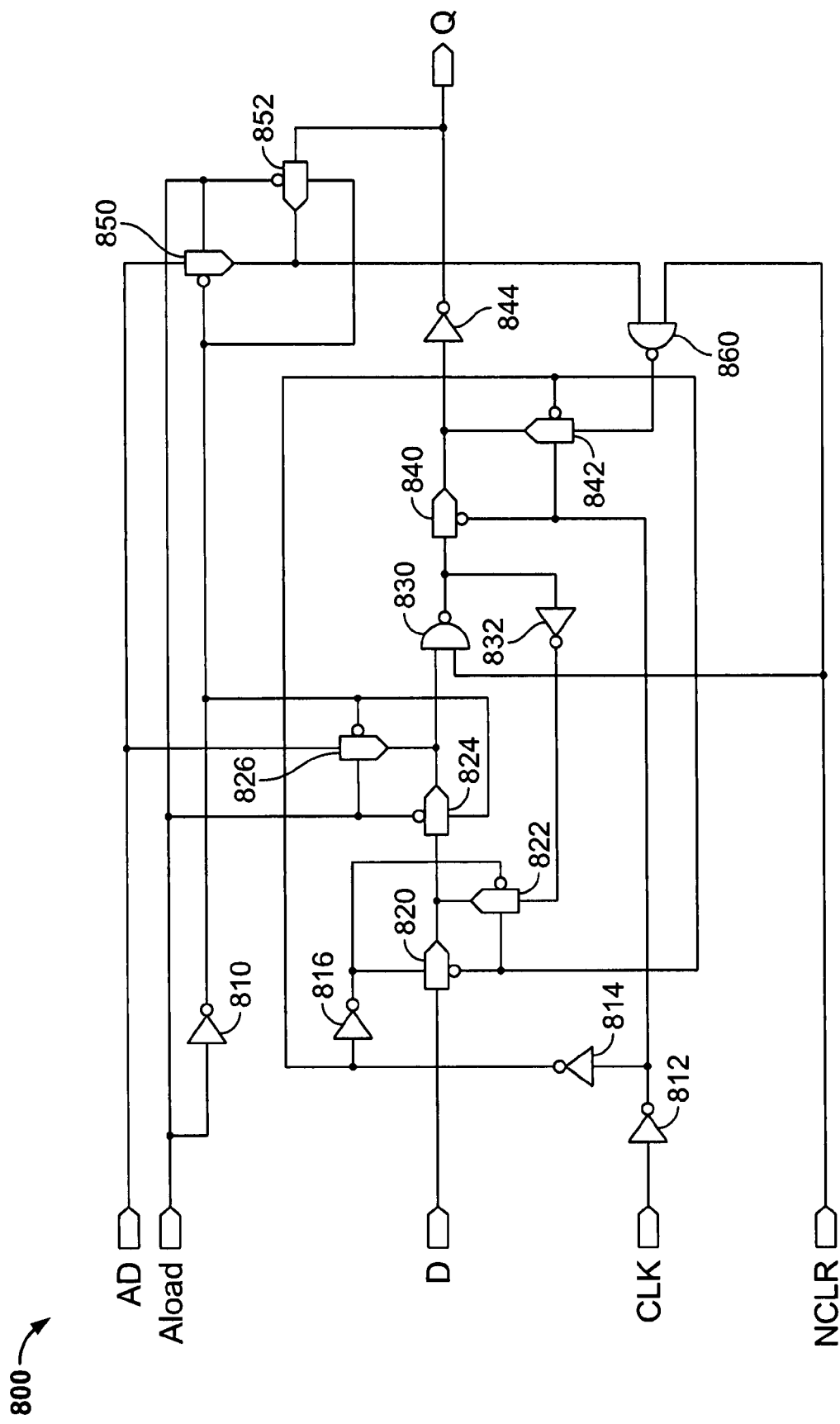

Still another example of how a latch can be implemented from a register is shown in FIG. 23. The register 800 in FIG. 23 includes inverters 810, 812, 814, 816, 832, and 844. It also includes pass gates 820, 822, 824, 826, 840, 842, 850, and 852. And it includes NAND gates 830 and 860. The AD input is the asynchronous data input, and ALOAD is the control signal for an asynchronous load function into the flip-flop. A latch can be implemented in this circuitry by sending data though the AD input, and routing the clock signal (high-phase or low-phase) to the ALOAD input. The CLK can be fixed to either high or low.

Although it is presently preferred to provide PLD circuitry with data storage circuit elements, at least some of which can be employed as either edge-triggered FFs or level-sensitive latches, an alternative is to provide all or a portion of the circuitry with only two-phase, level-sensitive latches for use in accordance with the principles of the invention as discussed above.

It will be understood that terms like PLD are used herein to mean logic circuitry that is programmable (and possibly also reprogrammable) in any of many different ways. For example, these ways may include various techniques such as field programmability, mask programmability, or the like. Certain aspects of the invention are applicable to logic circuitry generally, without associated programmability in whole or in part. The term "functional element" is used herein and in the appended claims to mean any type of circuit module or block that may be included on a PLD or the like and that may or may not have associated data storage circuitry. Examples of functional elements are LEs, DSP blocks, memory blocks, I/O blocks, etc. The term "logic circuitry" is used in the appended claims to include any type of functional element or functional elements.

The invention claimed is:

1. A method of converting a circuit design that employs a plurality of single-phase registers interconnected by logic circuitry and controlled by a first clock signal to a logically equivalent design in which at least one of the single-phase registers is replaced by two-phase latches, the method comprising:

converting at least one of the single-phase registers to a converted latch that is clocked by a first phase of a second clock signal that is faster than the first clock signal;

adding a first added latch to the logic circuitry that is upstream from the converted latch; and adding a second added latch to the logic circuitry that is downstream from the converted latch, the first and second added latches being clocked by a second phase of the second clock signal.

2. The method defined in claim 1 wherein in the converting all of the registers are converted to latches that are clocked by the first phase of the clock signal.

3. The method defined in claim 1 wherein the first added latch is added to a first circuit path leading from another converted latch that is clocked by the first phase of the clock signal.

4. The method defined in claim 3 wherein the first added latch is added to the first circuit path where the first added latch will subdivide signal propagation delay of the first circuit path.

5. The method defined in claim 4 wherein the first added latch is added to the first circuit path where the first added latch will approximately equally subdivide the signal propagation delay of the first circuit path.

6. The method defined in claim 4 wherein the second added latch is added to a second circuit path leading from the converted latch to another signal storage element that is clocked by the first phase of the clock signal.

7. The method defined in claim 6 wherein the second added latch is added to the second circuit path where the second added latch will subdivide signal propagation delay of the second circuit path.

8. The method defined in claim 7 wherein the second added latch is added to the second circuit path where the second added latch will approximately equally subdivide the signal propagation delay of the second circuit path.

9. A method of attempting to increase the speed at which a circuit can be clocked, the circuit including a plurality of single-phase, edge-triggered registers interconnected by logic circuitry, comprising:

identifying a first register-to-register path through the logic circuitry having a first relatively long signal propagation time;

identifying a second register-to-register path downstream from the first register-to-register path having a second relatively short signal propagation time;

converting single-phase, edge triggered registers in the first and second paths and any intervening register-to-register paths to first phase latches clocked by a first phase of a clock signal; and inserting at least one second phase latch clocked by a second phase of the clock signal in the logic circuitry downstream from each of the first phase latches.

10. The method defined in claim 9 wherein each second phase latch is inserted so as to subdivide signal propagation time of the path in which it is inserted.

11. The method defined in claim 10 wherein each second phase latch is inserted so that signal propagation time in any series from an initial one of the latches of either phase to an initial one of the latches of the other phase satisfies the relationships $TB[N]+DA \leq F_i TC$, $TB[N+1] \leq F_{i+1} TC$, and $TB[N+1]=TN[N]+DA+DB-F_{i+1} TC$, where N in an index identifying the series in order from upstream to downstream, TC is the period of the clock signal, $F_i$ is the fraction of the clock signal period that the latch at the end of series N is held open by the clock signal, DA is signal propagation time through any plurality of same-phase latches in series N, DB is signal propagation time through series N after any DA of that series, TB[N] is any signal propagation time effectively borrowed from series N for operation of logic circuitry of any series upstream from series N, and TB[N+1] is any signal propagation time effectively borrowed by series N for operation of its logic circuitry from any series downstream from series N.

12. The method defined in claim 11 wherein $F_i$ and $F_{i+1}$ are each approximately 0.5.

13. The method defined in claim 11 wherein TC is selected based on an average of the signal propagation times through all of the series.

14. The method defined in claim 9 wherein the identifying a first register-to-register path is performed so as to identify the register-to-register path having the longest signal propagation time.

15. Iteratively performing the method defined in claim 9 so that the first register-to-register paths identified in successive iterations progress from the register-to-register path having the longest signal propagation time to those having progressively shorter signal propagation times.

16. The method defined in claim 9 further comprising:

ensuring that there is at least one second phase latch inserted in any circuit path extending downstream from each of the first phase latches prior to driving a next first phase latch or register.

17. The method defined in claim 16 wherein if the ensuring results in plural second phase latches in series, attempting to move one of those second phase latches to a branch circuit path that is not in the series.

18. A method of attempting to increase the speed at which a circuit can be clocked, the circuit including a plurality of single-phase, edge-triggered registers interconnected by functional element circuitry, comprising:

converting single-phase, edge triggered registers to first phase latches clocked by a first phase of a clock signal;

adding a second phase latch clocked by a second phase of the clock signal to each of the functional elements that is not already associated with a first phase latch as a result of the converting;

ordering the functional elements to which second phase latches have been added based on the length of the signal propagation times for the register-to-register circuit paths in which those functional elements are used, and for functional elements used in at least the paths with longest signal propagation times, attempting to remove the second phase latches from functional elements that are closer to first phase latches, so that a minimum number of the second phase latches remain in the path and the second phase latches that remain are as close as possible to equally subdividing the signal propagation time of the path.

19. The method defined in claim 18 wherein for a path that has a relatively long signal propagation time and a plurality of the second phase latches in series, the method further comprises:

attempting to move one of the second phase latches from the series to a branch circuit path that is not in the series.

* * * * *